US010483328B2

(12) United States Patent
Lee et al.

(10) Patent No.: US 10,483,328 B2
(45) Date of Patent: Nov. 19, 2019

(54) ORGANIC LIGHT-EMITTING ELEMENT AND ORGANIC LIGHT-EMITTING DISPLAY DEVICE

(71) Applicant: DUK SAN NEOLUX CO., LTD, Cheonan-si, Chungcheongnam-do (KR)

(72) Inventors: Bum Sung Lee, Hwaseong-si (KR); Mun Jae Lee, Cheonan-si (KR); Sung Yun Mun, Cheonan-si (KR); Dae Sung Kim, Yongin-si (KR); Jung Cheol Park, Suwon-si (KR); Jae Taek Kwon, Cheonan-si (KR); Seok Jong Lee, Goyang-si (KR); Sun Pil Hwang, Ansan-si (KR)

(73) Assignee: Duk San Neolux Co., Ltd (KR)

( * ) Notice: Subject to any disclaimer, the term of this patent is extended or adjusted under 35 U.S.C. 154(b) by 33 days.

(21) Appl. No.: 15/557,037

(22) PCT Filed: Mar. 10, 2016

(86) PCT No.: PCT/KR2016/002379
§ 371 (c)(1),
(2) Date: Sep. 8, 2017

(87) PCT Pub. No.: WO2016/144109
PCT Pub. Date: Sep. 15, 2016

(65) Prior Publication Data
US 2018/0061902 A1 Mar. 1, 2018

(30) Foreign Application Priority Data
Mar. 12, 2015 (KR) .................. 10-2015-0034205

(51) Int. Cl.
*H01L 27/32* (2006.01)
*H01L 51/52* (2006.01)
*H01L 51/50* (2006.01)

(52) U.S. Cl.
CPC ...... *H01L 27/3211* (2013.01); *H01L 51/5056* (2013.01); *H01L 51/5203* (2013.01); *H01L 51/5265* (2013.01); *H01L 2227/323* (2013.01)

(58) Field of Classification Search
CPC ............ H01L 27/3213; H01L 27/3211; H01L 51/5056; H01L 51/5203; H01L 51/5265; H01L 2227/323
See application file for complete search history.

(56) References Cited

U.S. PATENT DOCUMENTS

| 8,507,904 | B2 | 8/2013 | Kim et al. |
| 9,017,828 | B2 | 4/2015 | Kim et al. |

(Continued)

FOREIGN PATENT DOCUMENTS

| CN | 103579522 A | 2/2014 |
| CN | 103855189 A | 6/2014 |

(Continued)

OTHER PUBLICATIONS

International Search Report (In English and Korean) and Written Opinion (in Korean) of the International Searching Authority issued in PCT/KR2016/002379, dated Jul. 12, 2016, ISA/KR.

*Primary Examiner* — Peniel M Gumedzoe
(74) *Attorney, Agent, or Firm* — Harness, Dickey & Pierce, PLC

(57) ABSTRACT

The present invention provides an organic light-emitting element comprising a first sub-pixel, a second sub-pixel, and a third sub-pixel, which have different colors, the organic light-emitting element comprising: a substrate; a first electrode arranged on the substrate; a second electrode arranged on the first electrode so as to face the first electrode; an organic light-emitting layer arranged between the first electrode and the second electrode, the organic light-emitting layer comprising a first organic light-emitting layer arranged on the first sub-pixel, a second organic light-emitting layer (Continued)

arranged on the second sub-pixel, and a third organic light-emitting layer arranged on the third sub-pixel; a hole transport layer arranged between the first electrode and the organic light-emitting layer; and a light-emitting supplement layer arranged between the hole transport layer and the organic light-emitting layer, the light-emitting supplement layer comprising a first light-emitting supplement layer, which is commonly arranged on the first sub-pixel, the second sub-pixel, and the third sub-pixel, a second light-emitting supplement layer, which is arranged on the second sub-pixel between the first light-emitting supplement layer and the second organic light-emitting layer, and a third light-emitting supplement layer, which is arranged on the third sub-pixel between the first light-emitting supplement layer and the third organic light-emitting layer.

3 Claims, 25 Drawing Sheets

(56) References Cited

U.S. PATENT DOCUMENTS

| | | | |
|---|---|---|---|
| 9,190,624 B2 | 11/2015 | Sim et al. | |
| 9,246,119 B2 | 1/2016 | Shim et al. | |
| 9,269,918 B2 | 2/2016 | Lee et al. | |
| 9,691,990 B2 | 6/2017 | Mun et al. | |
| 2003/0044639 A1* | 3/2003 | Fukuda | H01L 27/3211 428/690 |
| 2008/0252206 A1* | 10/2008 | Ryu | H01L 51/5265 313/504 |
| 2012/0305898 A1* | 12/2012 | Okamoto | H01L 51/5016 257/40 |
| 2013/0069044 A1* | 3/2013 | Ma | H01L 51/5036 257/40 |
| 2013/0334518 A1 | 12/2013 | Park et al. | |
| 2014/0027732 A1 | 1/2014 | Pyo et al. | |
| 2014/0209874 A1* | 7/2014 | Chun | H01L 51/5072 257/40 |
| 2016/0189611 A1* | 6/2016 | Jinta | H01L 51/504 345/690 |
| 2017/0141311 A1 | 5/2017 | Lee et al. | |
| 2017/0170407 A1 | 6/2017 | Park et al. | |

FOREIGN PATENT DOCUMENTS

| | | |
|---|---|---|
| CN | 103904178 A | 7/2014 |
| KR | 10-2014-0013513 A | 2/2014 |
| KR | 10-2014-0096438 A | 8/2014 |
| KR | 10-2014-0104248 A | 8/2014 |
| KR | 10-2014-0111839 A | 9/2014 |
| KR | 10-2014-0115688 A | 10/2014 |
| KR | 10-2014-0140337 A | 12/2014 |

* cited by examiner

FIG.10

ORGANIC LIGHT-EMITTING ELEMENT AND ORGANIC LIGHT-EMITTING DISPLAY DEVICE

CROSS-REFERENCE TO RELATED APPLICATION

This application is a U.S. National Phase Application under 35 U.S.C. 371 of International Application No. PCT/KR2016/002379 filed on Mar. 10, 2016 and published in Korean as WO 2016/144109 A1 on Sep. 15, 2016. This patent application claims priority under 35 U.S.C. § 119(a) from Korean Patent Application No. 10-2015-0034205, filed on 12 Mar. 2015. The disclosures of both of the above applications are incorporated herein by reference. Furthermore, this patent application claims priorities in countries other than the U.S., for the same reason based on the Korean Patent Application, the entire contents of which are incorporated herein by reference.

TECHNICAL FIELD

The present invention relates to an organic light emitting element and an organic light emitting display device including the organic light emitting element.

BACKGROUND ART

An organic light emitting element is a light emitting element in which, in an organic light emitting layer interposed between an anode and a cathode, holes flowing from the anode and electrons flowing from the cathode are recombined to form molecular excitons having a high-energy excited state, which returns to a low-energy ground state to thus emit the characteristic light of a material.

An organic light emitting element uses a material that emits light when a voltage is applied thereto, and has high brightness, excellent contrast, multiple-color capability, a wide viewing angle, a high response speed, and a low driving voltage.

An organic light emitting display for displaying an image is composed of a plurality of pixels each including an organic light emitting element. Each of the pixels may include two or more light emitting regions, a red light emitting region, a green light emitting region, and a blue light emitting region.

In spite of the described advantages, such an organic light emitting display device is difficult to manufacture with respect to the patterning and enlarging of the area of each of the pixels according to the light emitting region. Therefore, a currently important issue in the manufacturing process of the organic light emitting display device is to improve the luminous performance of organic light emitting elements or at least maintain the same performance as a conventional organic light emitting display device while reducing the number of times patterning for light emitting regions.

However, various attempts to manufacture an organic light emitting display device often end in failure.

DETAILED DESCRIPTION OF THE INVENTION

Technical Problem

An aspect of the present invention is to provide an organic light emitting element to minimize the patterning of light emitting regions at the time of manufacture and an organic light emitting display device including the organic light emitting element.

Another aspect of the present invention is to provide an organic light emitting element to improve the luminous performance and an organic light emitting display device including the organic light emitting element.

Technical Solution

In accordance with an aspect of the present invention, there is provided an organic light emitting element having first, second, and third sub-pixels with different colors on a substrate, the organic light emitting element comprising: first electrodes disposed on the substrate; a second electrode disposed on the substrate to face the first electrodes; organic light emitting layers disposed between the first electrodes and the second electrode, the organic light emitting layers comprising a first organic light emitting layer disposed in the first sub-pixel, a second organic light emitting layer disposed in the second sub-pixel, and a third organic light emitting layer disposed in the third sub-pixel; a hole transport layer disposed between the first electrodes and the organic light emitting layers; and auxiliary light emitting layers disposed between the hole transport layer and the organic light emitting layers, the auxiliary light emitting layers comprising: a first auxiliary light emitting layer commonly disposed in the first sub-pixel, the second sub-pixel, and the third sub-pixel; a second auxiliary light emitting layer disposed in the second sub-pixel between the first auxiliary light emitting layer and the second organic light emitting layer, and a third auxiliary light emitting layer disposed in the third sub-pixel between the first auxiliary light emitting layer and the third light emitting layer.

In accordance with another aspect of the present invention, there is provided an organic light emitting element comprising two or more sub-pixels on a substrate, the organic light emitting element comprising: first electrodes disposed on the substrate; a second electrode disposed on the first electrodes to face the first electrodes; two or more organic light emitting layers with different colors disposed in the two or more sub-pixels between the first electrodes and the second electrode; a hole transport layer disposed between the first electrodes and the organic light emitting layers; and auxiliary light emitting layers disposed between the hole transport layer and the organic light emitting layers, the auxiliary light emitting layers comprising: a common auxiliary light emitting layer commonly disposed in the two or more sub-pixels; and one or more individual auxiliary light emitting layers respectively disposed in some of the sub-pixels.

In accordance with another aspect of the present invention, there is provided an organic light emitting display device comprising the organic light emitting element of claim 1, the organic light emitting element comprising: driving transistors disposed in first, second, and third sub-pixels with different colors, the driving transistors each comprising a source, a drain, a gate, and an active layer; and the first, second, and third sub-pixels on a substrate, wherein each of the first electrodes of the organic light emitting element, which are respectively disposed in the first, second, and third sub-pixels, is electrically connected to one of the source and the drain of the driving transistor.

Advantageous Effects

The organic light emitting element and the organic light emitting display device including the organic light emitting element according to the present invention can minimize the patterning of light emitting regions at the time of manufacture.

Furthermore, the organic light emitting element and the organic light emitting display device including the organic light emitting element according to the present invention can attain improved luminous performance.

BRIEF DESCRIPTION OF THE DRAWINGS

FIG. 10 shows a pixel structure of the organic light emitting display panel in FIG. 9.

MODE FOR CARRYING OUT THE INVENTION

Hereinafter, exemplary embodiments of the present invention will be described in detail with reference to the accompanying drawings. Terms, such as first, second, A, B, (a), (b) or the like may be used herein when describing components of the present invention. Each of these terminologies is not used to define an essence, order or sequence of a corresponding component but used merely to distinguish the corresponding component from other component(s). It should be noted that if it is described in the specification that one component is "connected," "coupled" or "joined" to another component, a third component may be "connected," "coupled," and "joined" between the first and second components, although the first component may be directly connected, coupled or joined to the second component.

Figure 1:
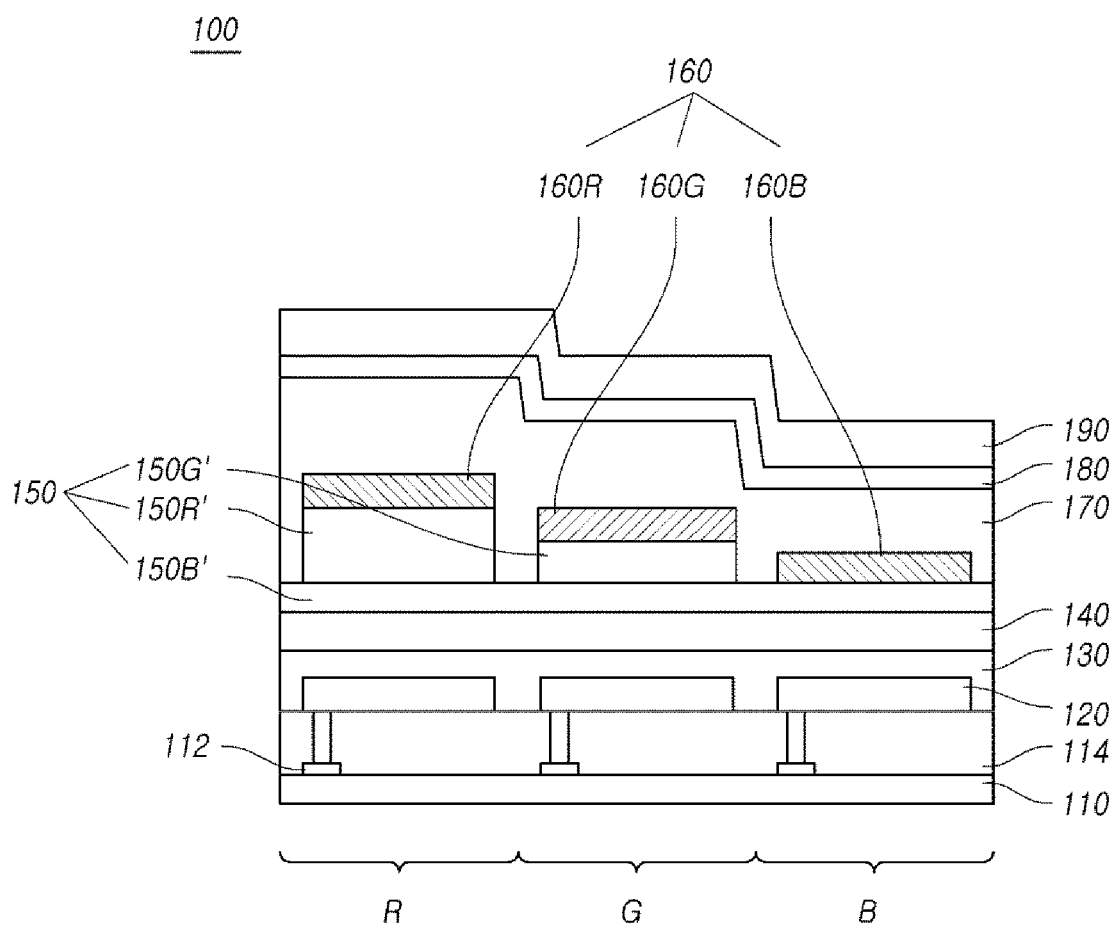
FIG. 1 is a cross-sectional view of an organic light emitting element according to an embodiment.

FIG. 1 is a cross-sectional view of an organic light emitting element according to an embodiment.

Referring to FIG. 1, an organic light emitting element 100 according to an embodiment includes first, second, and third sub-pixels with different colors on a substrate 110.

A substrate used in an ordinary organic light emitting element may be used for the substrate 110. The substrate 110 may be formed of glass or transparent plastic, and may be formed of a semi-transparent or opaque material, such as silicon or stainless steel.

The first sub-pixel, the second sub-pixel and the third sub-pixel may be a blue sub-pixel B, a green sub-pixel G, and a red sub-pixel R. For example, the blue sub-pixel B, the green sub-pixel G, and the red sub-pixel R may constitute each pixel Pij of an organic light emitting display device 600, as described with reference to FIG. 9.

The organic light emitting element 100 includes first electrodes 120 disposed on the substrate 110, a second electrode 190 disposed on the substrate 110 to face the first electrodes 120, and an organic light emitting layers 160 disposed between the first electrodes 120 and the second electrode 190. Here, the first electrodes 120 may correspond to an anode (positive electrode) and the second electrode 190 may correspond to a cathode (negative electrode). In the case of an inverted type, the first electrodes 120 may correspond to a cathode and the second electrode 190 may correspond to an anode. In the following description, the first electrodes 120 correspond to an anode (anode) and the second electrode 190 corresponds to a cathode.

The first electrodes 120 are separated on the insulating layer 114 of the substrate 110 for sub-pixel regions. The first electrode 120 for each sub-pixel region is electrically connected to any one (112) of a source and a drain through an insulating film 114 in a transistor, including the source, the drain, a gate, and an active layer.

The first electrode 120 may be formed of a material having a relatively high work function. The first electrode 120 may be formed of a transparent conductive oxide, for example, indium tin oxide (ITO), indium zinc oxide (IZO), ZnO (zinc oxide), AZO (Al-doped zinc oxide), $In_2O_3$ (indium oxide), or $SnO_2$ (tin oxide), but is not limited thereto. The first electrode 120 may be formed by deposition, sputtering, or the like.

The second electrode 190 may use a metal, an alloy, an electrically conductive compound, or a mixture of two or more thereof, which have a relatively low work function. As a specific example, a transmissive-type electrode may be formed by forming a thin film of lithium (Li), magnesium (Mg), aluminum (Al), aluminum-lithium (Al—Li), calcium (Ca), magnesium-indium (Mg—In), magnesium-silver (Mg—Ag), or the like. Meanwhile, various modifications may be possible, for example, a transmissive-type electrode may be formed using ITO or IZO in order to obtain a top emitting device.

The organic light emitting layers 160 may include a first organic light emitting layer 160B disposed in the first sub-pixel (for example, the blue sub-pixel B), a second organic light emitting layer 160G disposed in the second sub-pixel (for example, the green sub-pixel B), and a third organic light emitting layer 160R disposed in the third sub-pixel (for example, the red sub-pixel B). For example, the wavelength of the emitted light is larger in order of the first organic light emitting layer 160B, the second organic light emitting layer 160G, the third organic light emitting layer 160R. Specifically, the first organic light emitting layer 160B may be a blue organic light emitting layer, the second organic light emitting layer 160G may be a green organic light emitting layer, and the third organic light emitting layer 160R may be a red organic light emitting layer.

Here, the first organic light emitting layer 160B may contain a blue host and a blue dopant. As the blue host, for example, Alq3, 4,4'-N,N'-dicabazole-biphenyl (CBP), poly (n-vinylcabazole) (PVN), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl) anthracene (TBADN), E3, distyrylarylene (DSA), or a mixture of two or more thereof may be used, without limitation thereto.

As the blue dopant, compounds including $F_2$Irpic, $(F_2ppy)_2$Ir(tmd), Ir(dfppz)$_3$, ter-fluorene, 4,4'-bis(4diphenylaminostyryl)biphenyl (DPAVBi), 2,5,8,11-tetra-tbutylperylene (TBPe), and the like, may be used, without limitation thereto.

The first organic light emitting layer 160B can be formed by a method, such as, vacuum deposition, spin coating, casting, an LB method, or the like. When the light emitting layers are formed by vacuum deposition and spin coating, the deposition conditions vary depending on the compound that is used, but generally, the deposition conditions may be selected from substantially the same condition ranges as in the formation of a hole injection layer. Meanwhile, co-deposition may be used to form a layer containing a host and a dopant at the same time.

The second organic light emitting layer 160G may contain a green host and a green dopant. As the green host, Alq3, CBP, PVK, ADN, TCTA, TPBI, TBADN, E3, DSA, or a mixture of two or more thereof may be used, without limitation thereto.

As a green dopant, tris(2-phenylpyridine)iridium (Ir(ppy)$_3$), bis(2-phenylpyridine) (acetylacetonato)iridium (III)) ((Ir(ppy)$_2$(acac)), tris(2-(4-tolyl)phenylpirydine) iridium (Ir(mppy)$_3$), 10-(2benzothiazolyl)-1,1,7,7-tetramethyl-2,3,6,7-tetrahydro-1H,5H,11H-[1]benzopyrano[6,7,8-ij]-quinolizine-11-one (C545T), or the like may be used, without limitation thereto.

The third organic light emitting layer 160R may contain a red host and a red dopant. As the red host, like that of a first buffer layer 125R, Alq$_3$, CBP, PVK, ADN, TCTA, TPBI, TBADN, E3, DSA, or a mixture of two or more thereof may be used, without limitation thereto.

As a red dopant, compounds including PtOEP, Ir(piq)$_3$, Btp$_2$Ir(acac), Ir(Piq)$_2$(acac), Ir(2-phq)$_2$(acac), Ir(2-phq)$_3$, Ir(flq)$_2$(acac), Ir(fliq)$_2$(acac), DCM, or DCJTB may be used, without limitation thereto.

The second organic light emitting layer 160G and the third organic light emitting layer 160R may be formed by a method, such as, vacuum deposition, spin coating, casting, an LB method, or the like. Meanwhile, co-deposition may be used to form the second organic light emitting layer 126G and the third organic light emitting layer 126R each containing a host and a dopant.

The organic light emitting element 100 may include a hole transport layer 140 disposed between the first electrodes 120 and the organic light emitting layers 160 and auxiliary light emitting layers 150 disposed between the hole transport layer 140 and the organic light emitting layers 160.

The hole transport layer 140 may be formed of, for example, N,N-dinaphthyl-N,N'-diphenyl benzidine (NPD), 4,4',4''-Tris(N-3-methylphenyl-N-phenyl-amino)-triphenylamine (MTDATA), N,N'-bis(naphthalen-1-yl]-N,N'-bis (phenyl)-benzidine (NPB), or N,N'-bis(3-methylphenyl)-N, N'-bis(phenyl) (TPD), but is not limited thereto.

The auxiliary light emitting layer layers 150 may include: a first auxiliary light emitting layer 150B' commonly disposed in the first sub-pixel, the second sub-pixel, and the third sub-pixel; a second auxiliary light emitting layer 150G' disposed in the second sub-pixel between the first auxiliary light emitting layer 150B' and the second organic light emitting layer 160G; and a third auxiliary light emitting layer 150R' disposed in the third sub-pixel between the first auxiliary light emitting layer 150B' and the third organic light emitting layer 160R.

In other words, the second auxiliary light emitting layer 150G' is disposed in the second sub-pixel G on the first auxiliary light emitting layer 150B'. The third auxiliary light emitting layer 150R' is disposed in the third sub-pixel R on the first auxiliary light emitting layer 150B'.

The first auxiliary light emitting layer 150B', the second auxiliary light emitting layer 150G', and the third auxiliary light emitting layer 150R' may serve, for example, to transport holes, and may be formed of a hole transport material. Some of the first auxiliary light emitting layer 150B', the second auxiliary light emitting layer 150G', and the third auxiliary light emitting layer 150R' may be formed of the same material or different materials.

The hole transporting material that may be used for the first auxiliary light emitting layer 150B', the second auxiliary light emitting layer 150G', and the third auxiliary light emitting layer 150R' may be, for example, a carbazole derivative, such as N-phenyl carbazole or polyvinyl carbazole; a triphenyl amine-based material, such as N,NY-bis(3-methylphenyl)-N,N'-diphenyl-[1,1-biphenyl]-4,4'diamine (TPD); N,N'-di(1-naphthyl)-N,N'-diphenylbenzidine (NPB); 4,4',4''tris(N-carbazolyl)triphenylamine (TCTA), or the like, but is not limited thereto.

The second auxiliary light emitting layer 150G' and the third auxiliary light emitting layer 150R' may be formed by a method, such as, vacuum deposition, spin coating, casting, an LB method, or the like.

Meanwhile, the organic light emitting element 100 may further include a hole injection layer 140 between the first electrodes 120 and the hole transport layer 140. In addition, the organic light emitting element 100 may sequentially include an electron transport layer 170 and an electron injection layer 180 on the organic light emitting layers 160. A second electrode 190 is disposed on the electron injection layer 180.

The electron transport layer 170 is formed on a blue common light emitting layer 123, the red light emitting layer 126R, and the green light emitting layer 126G.

The electron transport layer 170 serves to transport the electrons injected from the cathode 190 to the light emitting layers, and may use a known material, for example, Alq$_3$, 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinoline-10-olate) (Bebq$_2$), or 9,10-di(naphthalene-2-yl)anthracene (ADN), but is not limited thereto.

The electron transport layer 170 may be formed by vacuum deposition, spin coating, casting, or the like.

When the electron transport layer 170 is formed by vacuum deposition and spin coating, the deposition conditions vary depending on the compound used, but generally, the deposition conditions may be selected from substantially the same condition range as in the formation of a hole injection layer 121.

The thickness of the electron transport layer 170 may be about 100 Å to about 1,000 Å, for example, about 150 Å to about 500 Å.

When the thickness of the electron transport layer 170 falls within above-described range, satisfactory electron transport characteristics can be attained without a substantial increase in driving voltage.

Alternatively, the electron transport layer 170 may contain an electron-transporting organic compound and a metal-containing material. The metal-containing material may contain a Li complex. A non-limiting example of the Li complex may be lithium quinolate (LiQ) or the like.

In addition, an electron injection layer 180 having a function of facilitating the injection of electrons from the second electrode 190 may be deposited on the electron transport layer 170. The electron injection layer 180 may use any material that is known as an electron injection layer material, such as LiF, NaCl, CsF, $Li_2O$, or BaO, but is not limited thereto. The deposition conditions of the electron injection layer 180 may vary depending on the compound that is used, but may generally be selected from almost the same condition ranges as in the formation of the hole injection layer 121.

The thickness of the electron injection layer 180 may be about 1 Å to about 100 Å, for example, about 3 Å to about 90 Å. When the thickness of the electron injection layer falls within the above-described range, satisfactory electron injection characteristics can be obtained without a substantial increase in driving voltage.

Alternatively, the electron transport layer 170 and the electron injecting layer 180 may be replaced with a functional layer having both an electron transport function and an electron injection function.

A second electrode 190 is disposed on the electron injection layer 180.

A capping layer (not shown) may be formed on the second electrode 190 in order to improve optical characteristics to thus maximize luminous efficiency. The capping layer (not shown) may be formed of, for example, a metal oxide layer, a metal nitride layer, or a metal oxynitride layer. The capping layer (not shown) may be formed of, for example, $MoO_x$ (x=2~4), $Al_2O_3$, $Sb_2O_3$, BaO, CdO, CaO, $Ce_2O_3$, CoO, $Cu_2O$, DyO, GdO, $HfO_2$, $La_2O_3$, $Li_2O$, MgO, NbO, NiO, $Nd_2O_3$, PdO, $Sm_2O_3$, ScO, $SiO_2$, SrO, $Ta_2O_3$, TiO, $WO_3$, $VO_2$, YbO, $Y_2O_3$, ZnO, ZrO, AlN, BN, NbN, SiN, TaN, TiN, VN, YbN, ZrN, SiON, AlON, or a mixture thereof.

Here, in the organic light emitting device 100, the other layers excluding the hole transport layer 140, the auxiliary light emitting layers 150, and the organic light emitting layers 160 are not formed between the first electrodes 120 and the second electrode 190. In addition, the organic light emitting element 100 may further include a hole blocking layer, an electron blocking layer, a buffer layer, and the like, and the electron transport layer 170 or the like may serve as a hole blocking layer.

Although not shown, the organic light emitting element 100 according to an embodiment may further include a protective layer or an optical efficiency-improving layer (capping layer) formed on at least one surface of each of the first electrodes 120 and the second electrode 190, the surface being on the other side of the organic light emitting layers 160.

From the aspect of light emission, the light emitted respectively from the first to third organic light emitting layers 160R, 160G, and 160B may reciprocate between the first electrodes 120 and the second electrode 190 to thus cause an interference phenomenon. Light having an integer multiple of the wavelength that corresponds to the distance between the first electrode 120 and the second electrode 190, which may cause resonance, may cause constructive interference to thus intensify the intensity thereof, and light having other wavelengths may cause destructive interference to thus weaken the intensity. Such a process of reciprocation and interference of light is called a microcavity effect.

Therefore, the distances between the first electrodes 120 and the second electrode 190 correspond to an integer multiple of the wavelength of the light emitted from the first to third organic light emitting layers 160R, 160G, and 160B for the sub-pixel. Hereinafter, it will be described that the optical path lengths of the light emitted from the organic light emitting layers 160 are set differently for respective sub-pixel using the thicknesses of the auxiliary light emitting layers 150.

Figure 2A:
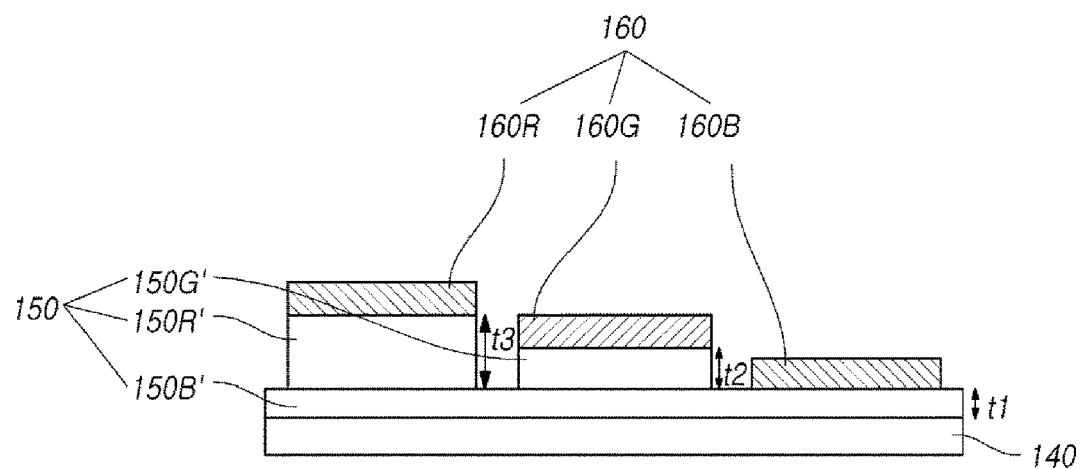
FIG. 2a shows the thicknesses of auxiliary light emitting layers in the organic light emitting element of FIG. 1.

FIG. 2a shows the thicknesses of auxiliary light emitting layers in the organic light emitting element of FIG. 1.

Referring to FIG. 2a, only the first auxiliary light emitting layer 150B' is disposed between the first organic light emitting layer 160B and the hole transport layer 140. Therefore, only the first auxiliary light emitting layer 150B' of the auxiliary light emitting layers 150 is disposed between the first organic light emitting layer 160B and the hole transport layer 140.

The first auxiliary light emitting layer 150B' and the second auxiliary light emitting layer 150G' are disposed between the second organic light emitting layer 160G and the hole transport layer 140. Therefore, the first auxiliary light emitting layer 150B' and the second auxiliary light emitting layer 150G' of the auxiliary light emitting layers 150 are disposed between the first organic light emitting layer 160B and the hole transport layer 140.

The first auxiliary light emitting layer 150B' and the third auxiliary light emitting layer 150R' are disposed between the third organic light emitting layer 160G and the hole transport layer 140. Therefore, the first auxiliary light emitting layer 150B' and the third auxiliary light emitting layer 150R' of the auxiliary light emitting layers 150 are disposed between the first organic light emitting layer 160B and the hole transport layer 140.

The auxiliary light emitting layers 150 may be layers for arranging the resonance distances of respective colors of the organic light emitting layers 160.

The first auxiliary light emitting layer 150B', the second auxiliary light emitting layer 150G', and the third auxiliary light emitting layer 150R' may have suitable thicknesses, respectively, in order to control the resonance distances for red light emission and green light emission and the recombination regions of electrons and holes. Here, the first auxiliary light emitting layer 150B', the second auxiliary light emitting layer 150G', and the third auxiliary light emitting layer 150R' may be added in order to fit the resonance distance for each color.

The thicknesses of the first auxiliary light emitting layer 150B' and the second auxiliary light emitting layer 150G' disposed between the second organic emission layer 160G and the hole transport layer 140 may be the same or substantially the same as the thickness of only the second second auxiliary light emitting layer 150G' when only the second auxiliary light emitting layer 150G' is disposed between the second organic light emitting layer 160G and the hole transport layer 140.

The thicknesses of the first auxiliary light emitting layer 150B' and the third auxiliary light emitting layer 150G' disposed between the third organic auxiliary light emitting layer 160R and the hole transport layer 140 may be the same or substantially the same as those of only the third auxiliary light emitting layer 150R' when only the third auxiliary light emitting layer 150R' is disposed between the third organic light emitting layer 160R and the hole transport layer 140.

Since the first auxiliary light emitting layer 150B' is commonly disposed in the first, second, and third sub-pixels, the third auxiliary light emitting layer 150R', which has the largest wavelength of emitted light, may be thicker than the second auxiliary light emitting layer 150G', which has a relatively small wavelength of emitted light. The thickness of the second auxiliary light emitting layer 150G' may be about 30 Å to about 300 Å, for example, about 50 Å to about 100 Å. The thickness of the third auxiliary light emitting layer 150R' may be about 30 Å to about 700 Å, for example, about 50 Å to about 200 Å.

The second auxiliary light emitting layer 150G' may be thicker than the first auxiliary light emitting layer 150B'. For example, the thickness of the first auxiliary light emitting layer 150B' may be about 30 Å to about 250 Å, for example, about 50 Å to about 100 Å.

In the organic light emitting element 100 according to an embodiment, the optical path lengths of the light emitted from the organic light emitting layers 160 are set differently for respective sub-pixels using the thicknesses of the auxiliary light emitting layers 150, thereby implementing a microcavity effect.

Figure 2B:
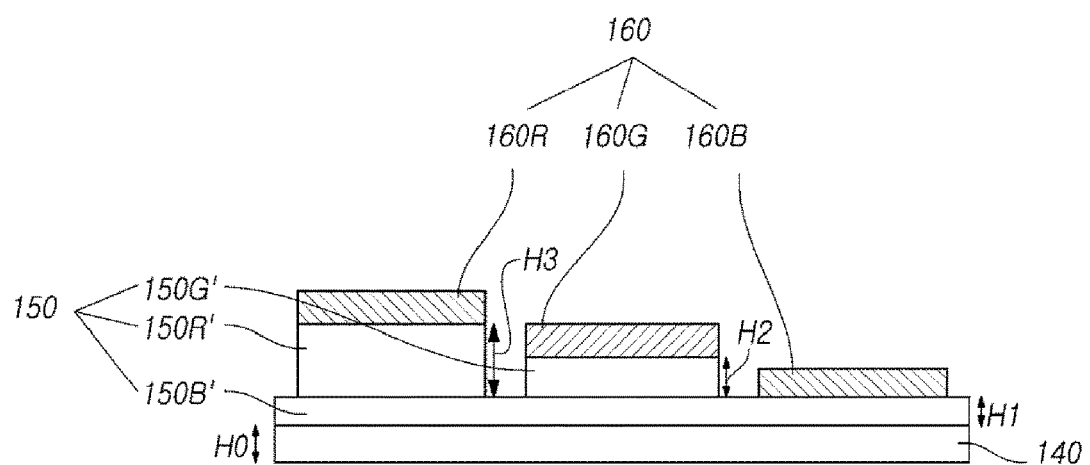
FIG. 2b shows HOMO levels of a hole transport layer and auxiliary light emitting layers in the organic light emitting element of FIG. 1.

FIG. 2b shows HOMO levels of a hole transport layer and auxiliary light emitting layers in the organic light emitting element of FIG. 1.

Referring to FIG. 2b, the auxiliary light emitting layers 150 may serve to assist in hole transfer for respective colors of the hole transport layer 140.

The first auxiliary light emitting layer 150B', the second auxiliary light emitting layer 150G', and the third auxiliary light emitting layer 150R' may have suitable energy levels, for example, highest occupied molecular orbital (HOMO) levels, in order to assist hole transport for each color.

The first auxiliary light emitting layer 150B' disposed between the first organic light emitting layer 160B and the hole transport layer 140 may have a larger HOMO level than the hole transport layer 140. In other words, the HOMO level H1 of the first auxiliary light emitting layer 150B may be smaller than the HOMO level H0 of the hole transport layer 140.

The second auxiliary light emitting layer 150G' disposed between the hole transport layer 140 and the first auxiliary light emitting layer 150B' may have a larger HOMO level than the first auxiliary light emitting layer 150B'. In other words, the HOMO level H2 of the second auxiliary light emitting layer 150G' may be larger than the HOMO level H1 of the first auxiliary light emitting layer 150B'. The third auxiliary light emitting layer 150R' disposed between the hole transport layer 140 and the first auxiliary light emitting layer 150B' may have a larger HOMO level than the first auxiliary light emitting layer 150B'. In other words, the HOMO level H3 of the third auxiliary light emitting layer 150R' may be larger than the HOMO level H1 of the first auxiliary light emitting layer 150B'.

The HOMO level H1 of the first auxiliary light emitting layer 150B' may be larger than the HOMO level H0 of the hole transport layer 140, and the HOMO level H2 of the second auxiliary light emitting layer 150G' may be smaller than the HOMO level H3 of the third auxiliary light emitting layer 150R'.

The materials for the first auxiliary light emitting layer 150B', the second auxiliary light emitting layer 150G', and the third auxiliary light emitting layer 150R' may be the foregoing hole transporting materials satisfying energy levels.

Since the HOMO level difference ($\Delta$HOMO=H2−H0) between the hole transport layer 140 and the second auxiliary light emitting layer 150G' is relatively large, it is relatively inefficient to transport holes from the first electrode 120 directly to the second auxiliary light emitting layer 150G' via the hole transport layer 140. On the contrary, the HOMO level is higher in order of the hole transport layer 140, the first auxiliary light emitting layer 150bB', the second auxiliary light emitting layer 150G', and thus, the holes can be efficiently transported by stages from the first electrode 120, via the hole transport layer 140, to the first auxiliary light emitting layer 150B', the second auxiliary light emitting layer 150G'.

In a similar manner, since the HOMO level difference ($\Delta$HOMO=H3−H0) between the hole transport layer 140 and the third auxiliary light emitting layer 150G' is relatively large, it is relatively inefficient to transport holes from the first electrode 120, via the hole transport layer 140, to the third auxiliary light emitting layer 150R'. On the contrary, the HOMO level is higher in order of the hole transport layer 140, the first auxiliary light emitting layer 150B', the third auxiliary light emitting layer 150G', and thus, the holes can be efficiently transported by stages from the first electrode 120, via the hole transport layer 140, to the first auxiliary light emitting layer 150B', the third auxiliary light emitting layer 150R'.

Figure 2C:
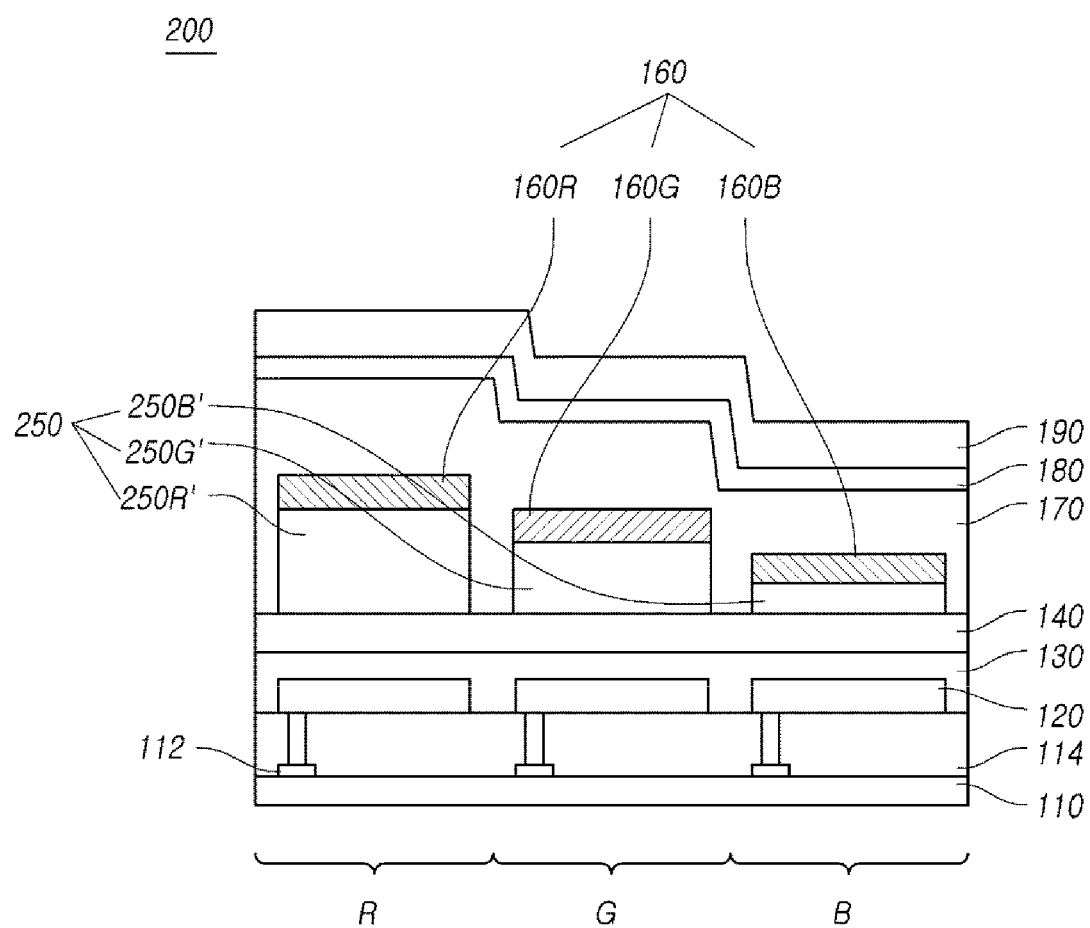
FIG. 2c is a cross-sectional view of an organic light emitting element according to Comparative Embodiment 1.

FIG. 2c is a cross-sectional view of an organic light emitting element according to Comparative Embodiment 1.

An organic light emitting element 200 according to Comparative Example 1 shown in FIG. 2c may be the same as the organic light emitting device according to the embodiment described with reference to FIG. 1 except that a first organic light emitting layer 160B, a second organic light emitting layer 160G, and a third organic light emitting layer 160R are disposed on a first auxiliary light emitting layer 250B', a second auxiliary light emitting layer 250G', and a third auxiliary light emitting layer 250R', respectively, for each pixel.

As described above, from the aspect of hole transport capability or hole mobility according to HOMO level, compared with the structure in which the first organic light emitting layer 160B, the second organic light emitting layer 160G, and the third organic light emitting layer 160R are disposed on the first auxiliary light emitting layer 150B', the second auxiliary light emitting layer 150G', and the third auxiliary light emitting layer 150R', respectively, for each pixel, the foregoing organic light emitting element 100 according to an embodiment can improve the hole mobility since holes are transported from the hole transport layer 140 to the second organic light emitting layer 160G via the first auxiliary light emitting layer 150B' and the second auxiliary light emitting layer 150G'.

Meanwhile, the organic light emitting element 100 according to an embodiment may be manufactured by employing vacuum deposition. Some of the organic material layers including the hole transport layer 140, the auxiliary light emitting layers 150, and the organic light emitting layers 160 may be formed using various polymer materials not through vacuum deposition but through a solution process or a solvent process, such as spin coating, nozzle printing, inkjet printing, slot coating, dip coating, a roll-to-roll process, doctor blading, screen printing, or thermal transfer. The organic material layers including the hole transport layer 140, the auxiliary light emitting layers 150, and the organic light emitting layers 160 may be formed by various methods, and thus the scope of the present invention is not limited as to the forming method thereof.

Hereinafter, a method for manufacturing an organic light emitting device by vacuum deposition according to another embodiment will be described. In the method for manufacturing an organic light emitting element by vacuum deposition according to another embodiment, the materials and thicknesses of the respective layers may be the same as those in FIGS. 1 to 2b.

FIGS. 3a to 3g show a process flow of a method for manufacturing an organic light emitting element according to another embodiment.

Overall, by vacuum deposition, (i) first electrodes 120 may be formed on a substrate 110 for each sub-pixel; (ii) a hole injection layer 130 and a hole transport layer 140 may be commonly formed thereon; (iii) auxiliary light emitting layers 150 and organic light emitting layers 160 may be formed for each sub-pixel; and (iv) an electron transport layer 170 and an electron injection layer 180 may be commonly formed, and a second electrode 190 may be commonly formed thereon.

Figure 3A:
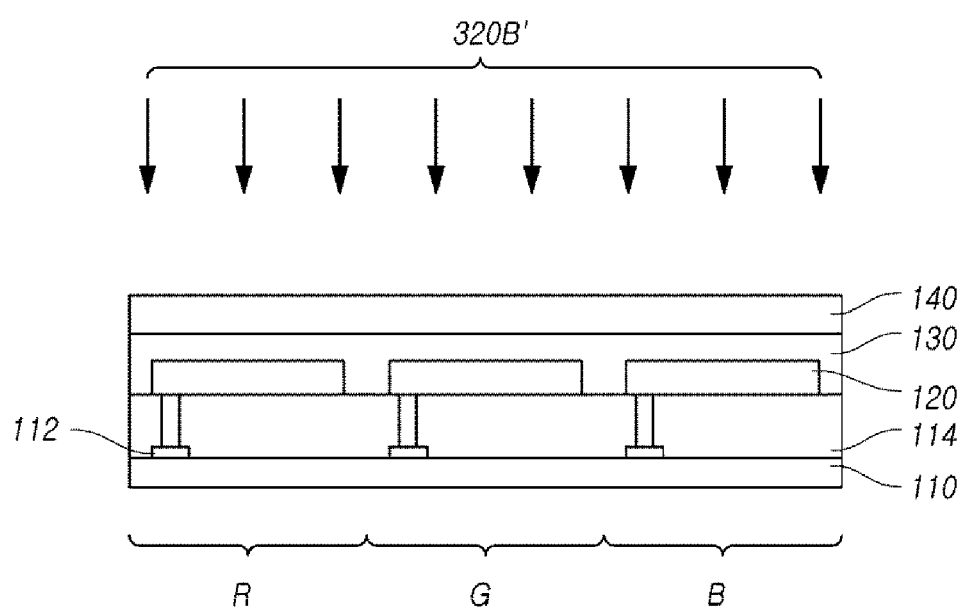
FIGS. 3a to 3g show a process flow of a method for manufacturing an organic light emitting element according to another embodiment.

Referring to FIG. 3a, a transistor including a source, a drain, a gate, and an active layer is formed on a substrate 210, after which an insulating film 114 is formed on the transistor, and first electrodes (220) are formed on the insulating layer 114 for sub-pixel regions. Here, in the transistor, the insulating film 114 and the first electrodes 120 are formed such that each of the first electrodes 120 is electrically connected to one 112 of the source and drain through the insulating film 114 in the transistor.

A hole injection layer 130 and a hole transport layer 140 are sequentially formed on the first electrodes 120.

Then, a first auxiliary light emitting layer 150B' is commonly formed of a first auxiliary light emitting material (320B') in the first sub-pixel B, the second sub-pixel G, and the third sub-pixel R on the hole transport layer 140.

Figure 3B:
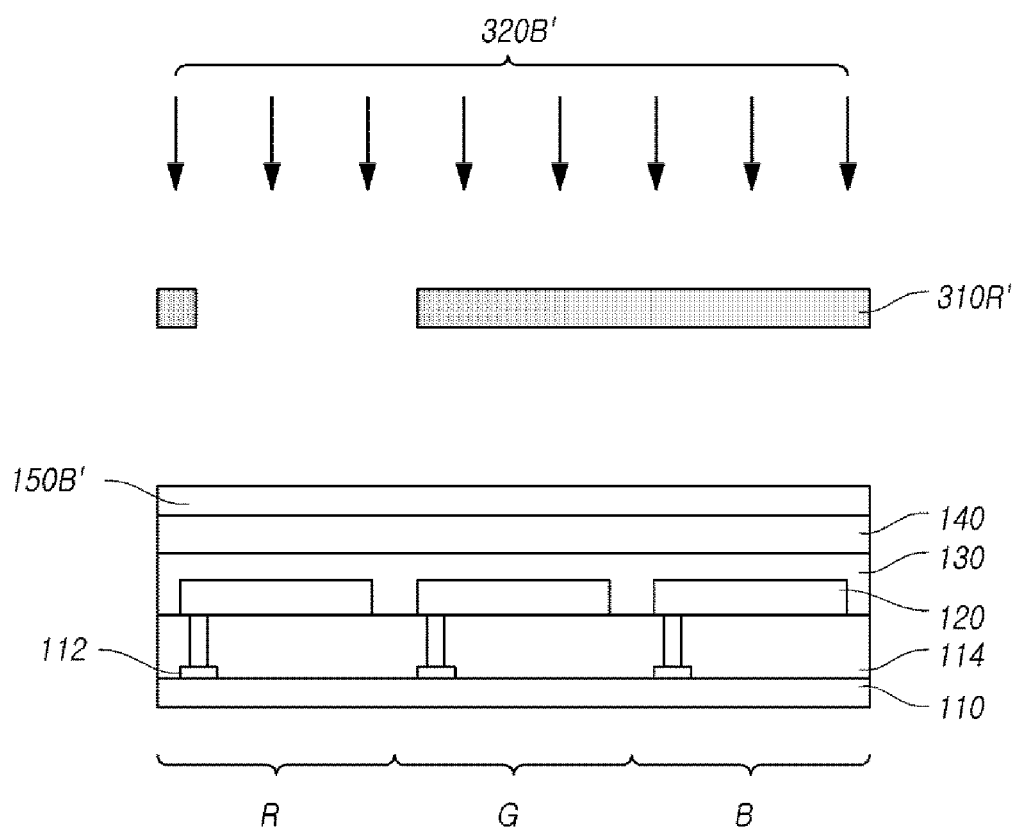

Referring to FIG. 3b, a third auxiliary light emitting layer 150R' is formed of a third auxiliary light emitting material 320R' in the third sub-pixel R on the first auxiliary light emitting layer 150B' using a first mask 310R' of which a portion corresponding to the third sub-pixel R is opened.

Figure 3C:
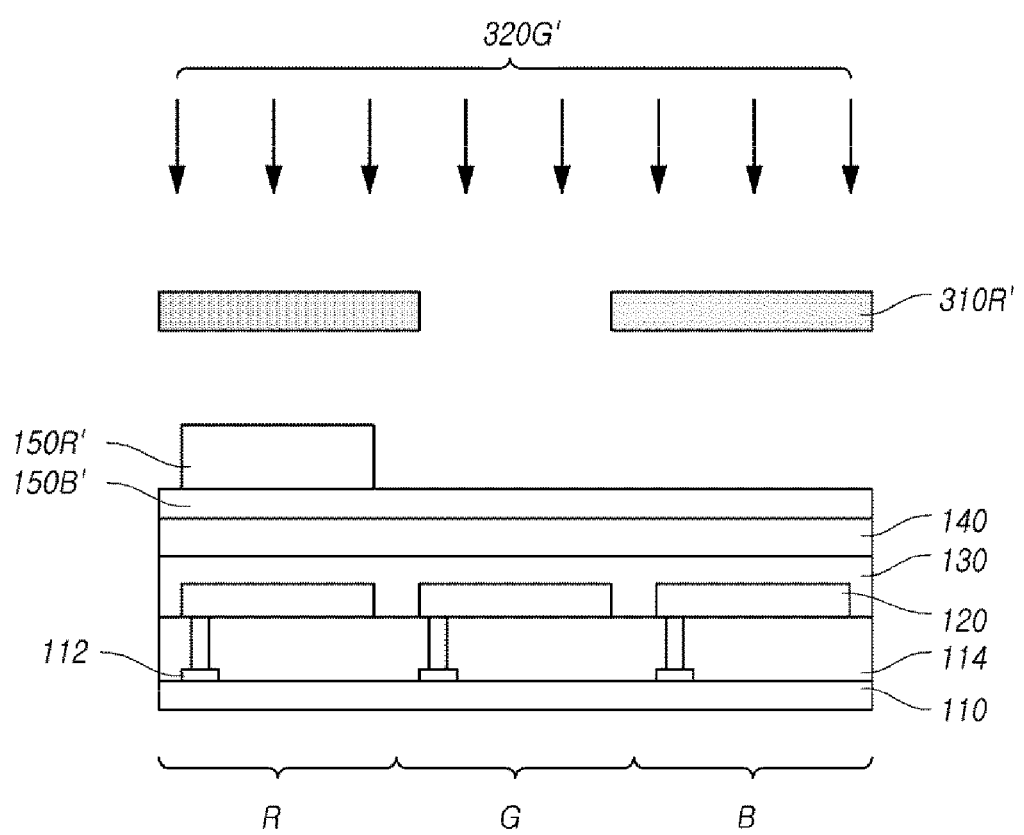

Referring to FIG. 3c, a second auxiliary light emitting layer 150G' is formed of a second auxiliary light emitting material 320G' in the second sub-pixel G on the first auxiliary light emitting layer 150B' using a second mask 310G' of which a portion corresponding to the second sub-pixel G is opened.

It has been described that the third auxiliary light emitting layer 150R' and the second auxiliary light emitting layer 150G' are sequentially formed on the first auxiliary light emitting layer 150B' with reference to FIGS. 3b and 3c, but the second auxiliary light emitting layer 150G' and the third auxiliary light emitting layer 150R' may be sequentially formed on the first auxiliary light emitting layer 150B'.

The thicknesses and the energy levels of the first auxiliary light emitting layer 150B', the second auxiliary light emitting layer 150G', and the third auxiliary light emitting layer 150R' are as described with reference to FIGS. 2a and 2b.

That is, the third auxiliary light emitting layer 150R' may be thicker than the second auxiliary light emitting layer 150G', and the second auxiliary light emitting layer 150G' may be thicker than the first auxiliary light emitting layer 150B'. The HOMO level HMOM1 of the first auxiliary light emitting layer 150B' may be higher than the HOMO level H0 of the hole transport layer, but may be lower than the HOMO level H2 of the second auxiliary light emitting layer or the HOMO level H3 of the third auxiliary light emitting layer.

As described above, the materials for the first auxiliary light emitting layer 150B', the second auxiliary light emitting layer 150G', and the third auxiliary light emitting layer 150R' may be hole transporting materials satisfying energy levels.

Figure 3D:
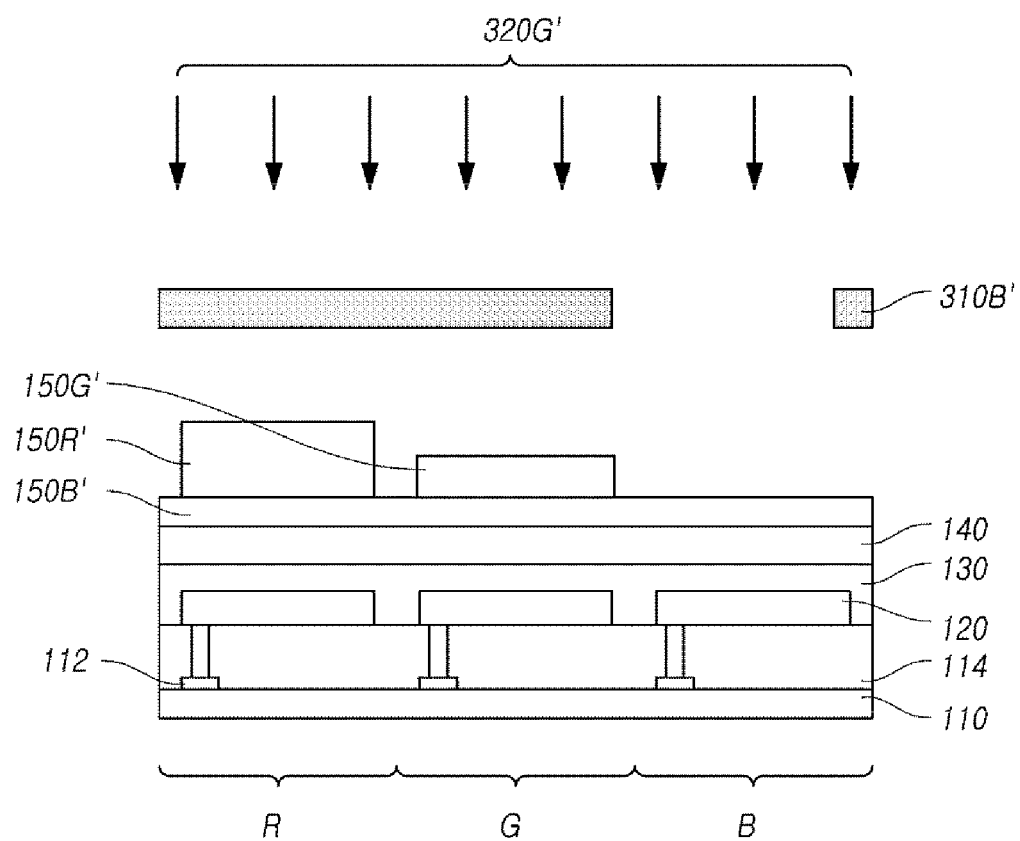
Figure 3E:
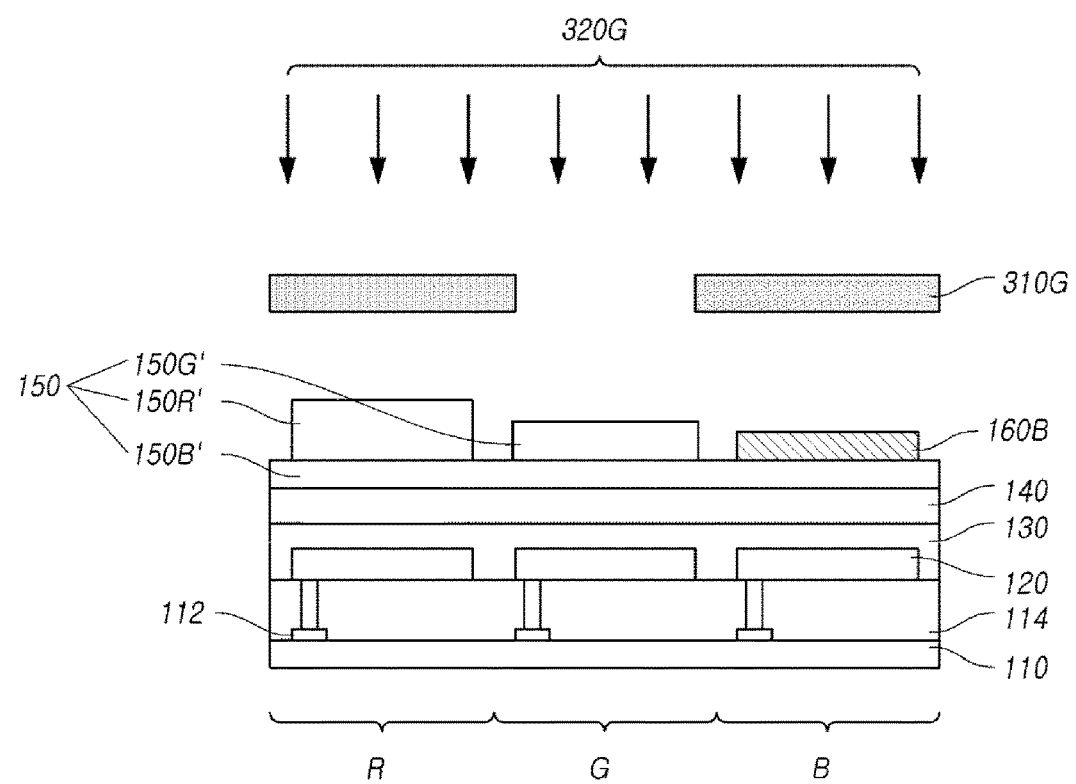
Figure 3F:
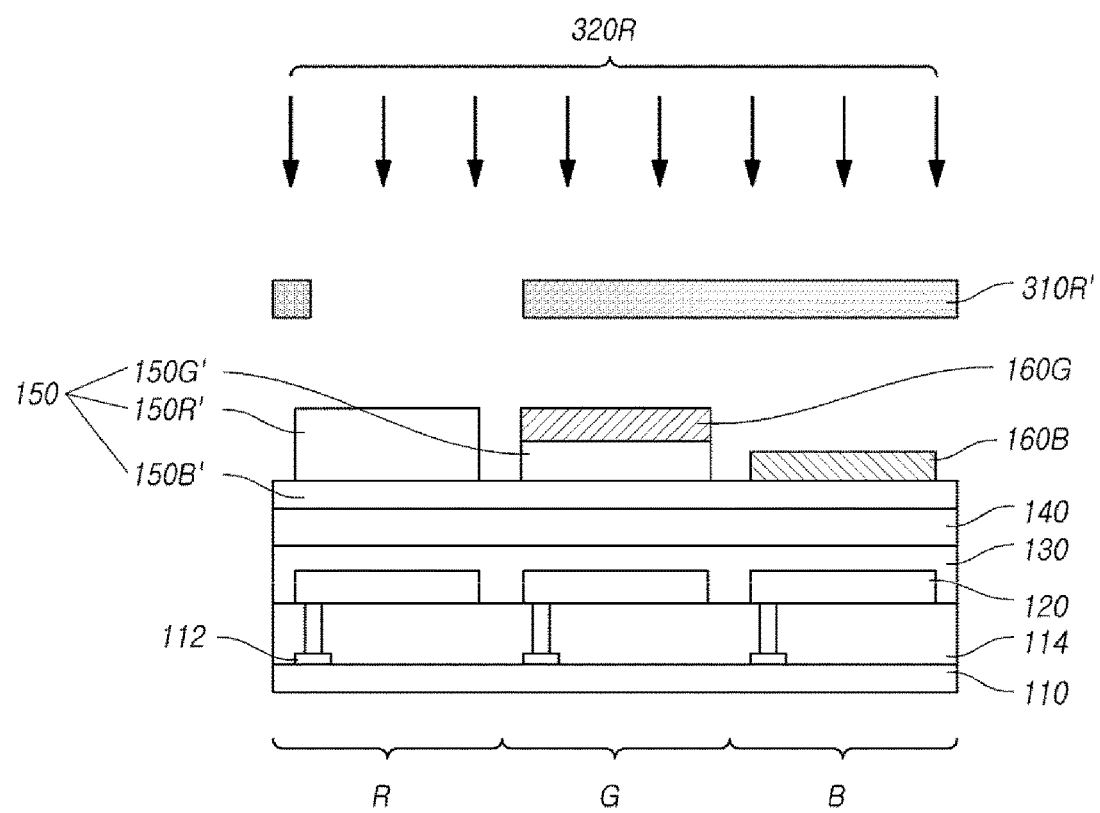
Figure 3G:
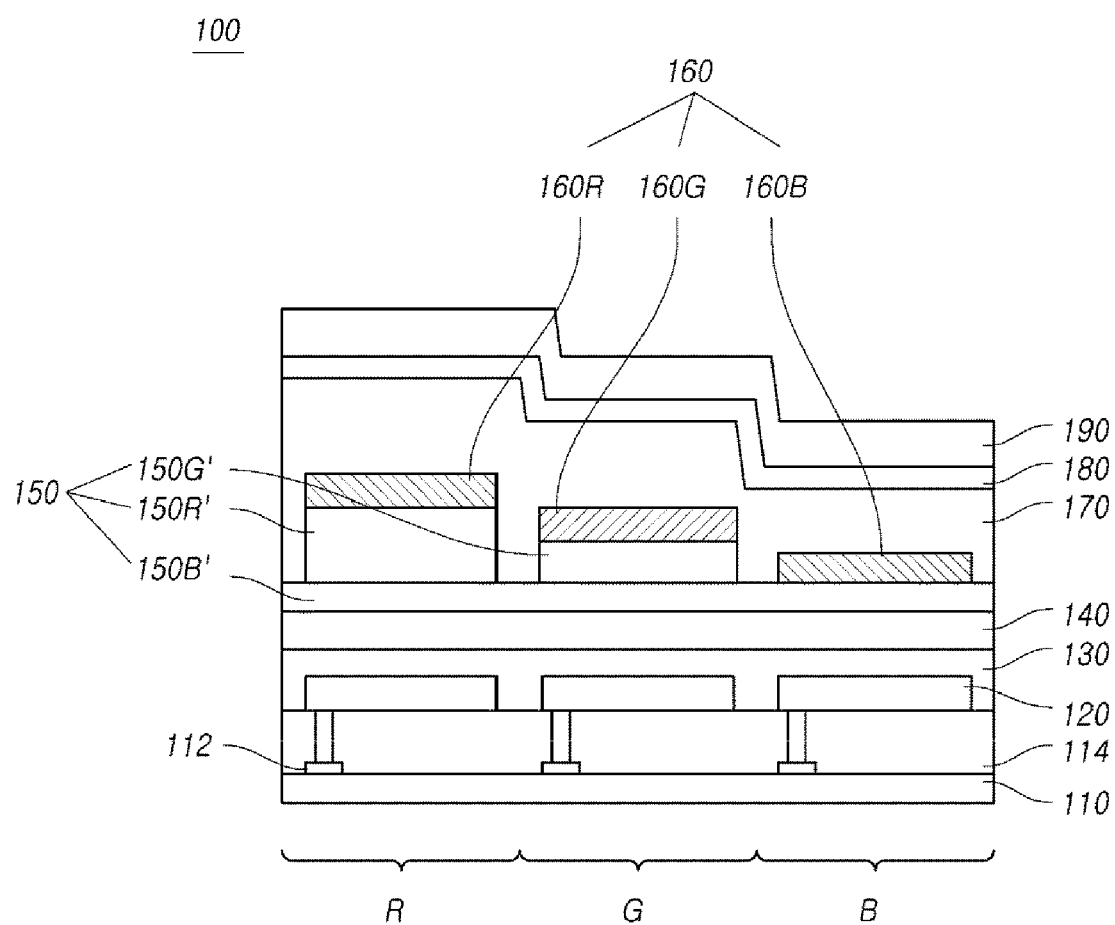

Referring to FIGS. 3d to 3f, first to third organic light emitting layers 160B, 160G, and 160R may be formed in the respective first to third sub-pixels on the first auxiliary light emitting layer 150B', on which the second auxiliary light layer 150G' and the third auxiliary light emitting layer 150R' are respectively formed in the second sub-pixel G and the third sub-pixel, by using third to fifth masks 310B, 310G, and 310R.

In the manufacture of the organic light emitting element according to another embodiment, described with reference to FIGS. 3a to 3g, the auxiliary light emitting layers 150 and the organic light emitting layers 160 may be formed for respective sub-pixels by using only a total of five masks (first to fifth masks).

Compared with when a total of six masks needs to be used in the manufacture of the organic light emitting element 200 according to Comparative Embodiment 1 shown in FIG. 2c in which the first organic light emitting layer 160B, the second organic light emitting layer 160G, and the third organic light emitting layer 160R are arranged on the first auxiliary light emitting layer 250B', the second auxiliary light emitting layer 250G', and the third auxiliary light emitting layer 250R', for each pixels, only a total of five masks (first to five masks) can be used in the manufacture of the organic light emitting element 100 according to the embodiment, described with reference to FIGS. 3a to 3g, so that process efficiency is improved, and the area of an organic light emitting display device including the organic light emitting element 100 can be enlarged.

Figure 4:
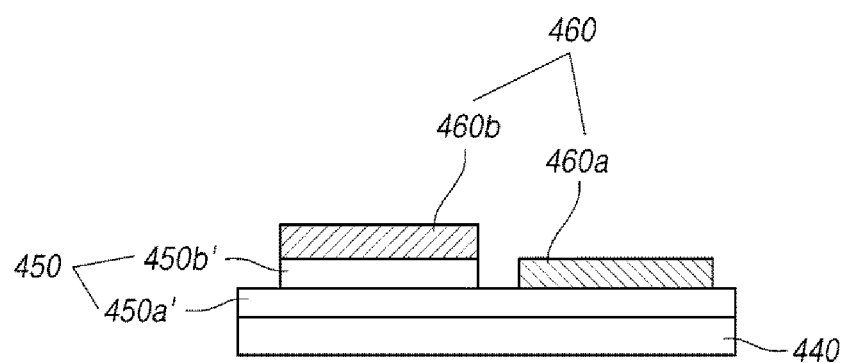
FIG. 4 is a cross-sectional view of an organic light emitting element according to still another embodiment.

FIG. 4 is a cross-sectional view of an organic light emitting element according to still another embodiment.

Referring to FIG. 4, an organic light emitting diode according to another embodiment includes two or more sub-pixels on a substrate. Here, the organic light emitting element may include first electrodes disposed on a substrate, a second electrode disposed on the first electrodes to face the first electrodes, two or more organic light emitting layers 460 with different colors disposed in two or more sub-pixels between the first electrodes and the second electrode, a hole transport layer 440 disposed between the first electrodes and the organic light emitting layers 460, and auxiliary light emitting layers 450 disposed between the hole transport layer 440 and the organic light emitting layers 460.

Here, the auxiliary light emitting layers 450 may include: a common auxiliary light emitting layer 450a' commonly disposed in two or more sub-pixels a' and 'b'; and one or more individual auxiliary light emitting layers 450b' respectively disposed in some of the sub-pixels.

The number of sub-pixels may be two to four. In the case of three sub-pixels, a corresponding organic light emitting element is the same as the organic light emitting element 100 described with reference to FIG. 1. In the case of four sub-pixels, a corresponding organic light emitting element is an organic light emitting element having one additional sub-pixel (for example, a white sub-pixel) in addition to the organic light emitting element 100 described with reference to FIG. 1.

The organic light emitting layers may include two to four organic light emitting layers disposed in the two to four sub-pixels, respectively. In the case of two sub-pixels, the organic light emitting layers 460 may include a first organic light emitting layer 460*a* and a second organic light emitting layer 460*b* as shown in FIG. 4.

The auxiliary light emitting layers 450 may include: a common auxiliary light emitting layer commonly disposed in the two to four sub-pixels; and one to three individual auxiliary light emitting layers respectively disposed in the one to three sub-pixels.

Figure 5:
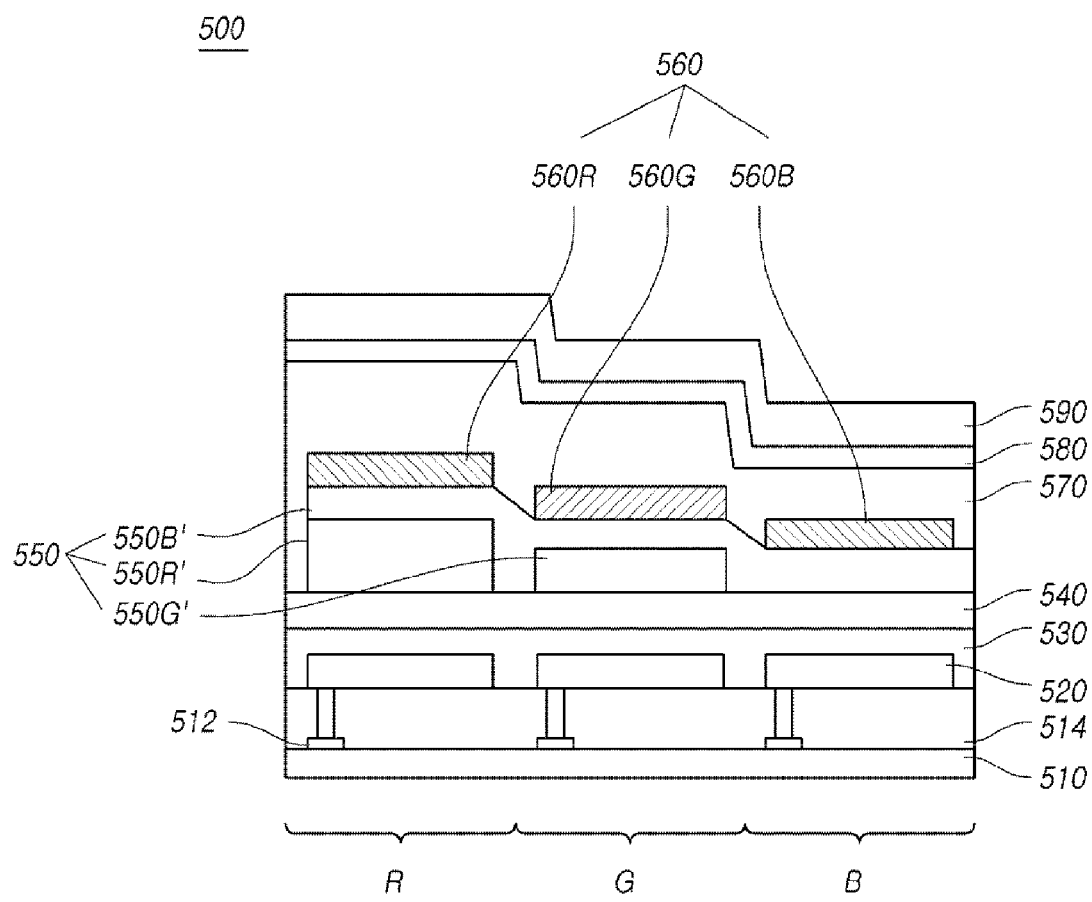
FIG. 5 is a cross-sectional view of an organic light emitting element according to Comparative Embodiment 2.

FIG. 5 is a cross-sectional view of an organic light emitting element according to Comparative Embodiment 2.

Referring to FIG. 5, an organic light emitting element 500 according to Comparative Embodiment 2 is different from the organic light emitting element 100 described in FIG. 1 in which a first auxiliary light emitting layer 550B' is commonly disposed on a hole transport layer 540, on which a second auxiliary light emitting layer 550G' and a third auxiliary light emitting layer 550R' are formed, and first to third organic light emitting layers 560B, 560G, and 560R are respectively formed in first to third sub-pixels B, G, and R on the first auxiliary light emitting layer 550B'.

That is to say, the auxiliary light emitting layers may include: a first auxiliary light emitting layer 550B' commonly disposed in the first sub-pixel, the second sub-pixel, and the third sub-pixel; a second auxiliary light emitting layer 550G' disposed in the second sub-pixel between the first auxiliary light emitting layer 550B' and the hole transport layer 540; and a third auxiliary light emitting layer 550R' disposed in the third sub-pixel between the first auxiliary light emitting layer 550B' and the hole transport layer 540.

Since the first auxiliary light emitting layer 450B' is commonly disposed in the first, second, and third sub-pixels, the third auxiliary light emitting layer 550R' having the largest wavelength of emitted light may be thicker than the second auxiliary light emitting layer 550G' having a relatively small wavelength of emitted light.

In addition, the second auxiliary light emitting layer 550G' may be thicker than the first auxiliary light emitting layer 550B'.

In addition, the organic light emitting element 500 according to Comparative Embodiment 2, in which the optical path lengths of the light emitted from the organic light emitting layers 560 are set differently for respective sub-pixel using the thickness of the auxiliary light emitting layers 550, thereby implementing a microcavity effect, may be the same as the organic light emitting element 100 according to the embodiment described with reference to FIG. 1.

Meanwhile, the organic light emitting element according to Comparative Embodiment 2 is the same as the organic light emitting element 100 described with reference to FIG. 1 in that an insulating layer 514, first electrodes 520, a hole injection layer 530, and a hole transport layer 540 are disposed on a first substrate 510, and an electron transport layer 570, an electron injection layer 580, and a second electrode 590 are disposed on the organic light emitting layers 560.

The organic light emitting element 500 according to Comparative Embodiment 2 may also employ only a total of five masks (first to fifth masks) in the same manner as in the method for manufacturing the organic light emitting element according to another embodiment described with reference to FIGS. 3*a* to 3*g*.

However, from the aspect of hole transport capability or hole mobility according to the HOMO level, the organic light emitting element 500 according to Comparative Embodiment 2 may have deteriorated hole mobility since holes are transported from the hole transport layer 540 to the second organic light emitting layer 560G via the second auxiliary light emitting layer 550G' and the first auxiliary light emitting layer 550B', or to the third organic light emitting layer 560R via the third auxiliary light emitting layer 550R' and the first auxiliary light emitting layer 550B', Hereinafter, the measurement results of voltage-current characteristics, luminescence-current efficiency characteristics, and lifetime characteristics of the first to third sub-pixels in the organic light emitting element 100 according to the embodiment in FIG. 1, the organic light emitting element 200 according to Comparative Embodiment 1 in FIG. 2*c*, and the organic light emitting element 500 according to Comparative Embodiment 2 in FIG. 5 will be described.

Figure 6A:
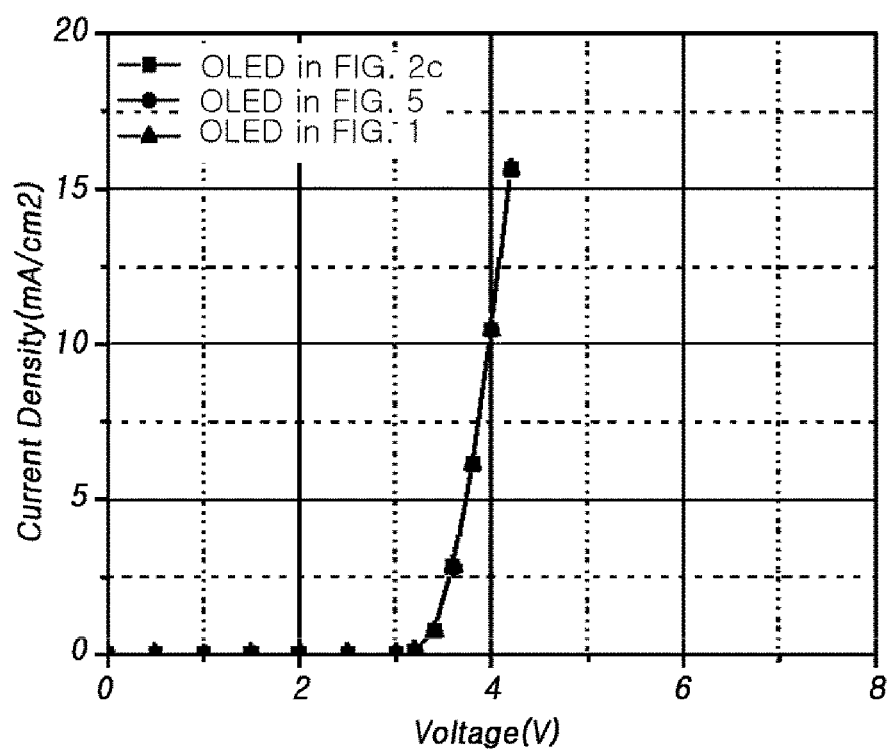
FIGS. 6a to 6c show voltage-current characteristics, luminance-current efficiency characteristics, and lifetime characteristics of a first sub-pixel in each of the organic light emitting element according to the embodiment in FIG. 1, the organic light emitting element according to Comparative Embodiment 1 in FIG. 2c, and the organic light emitting element according to Comparative Embodiment 2 in FIG. 5.
Figure 6B:
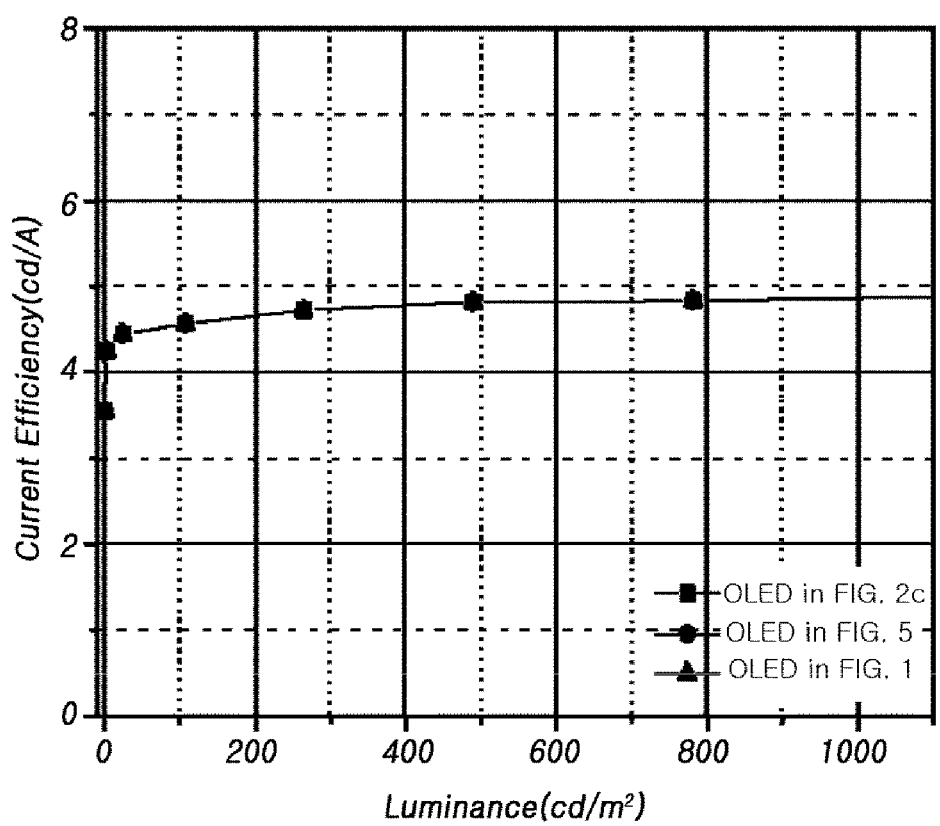
Figure 6C:
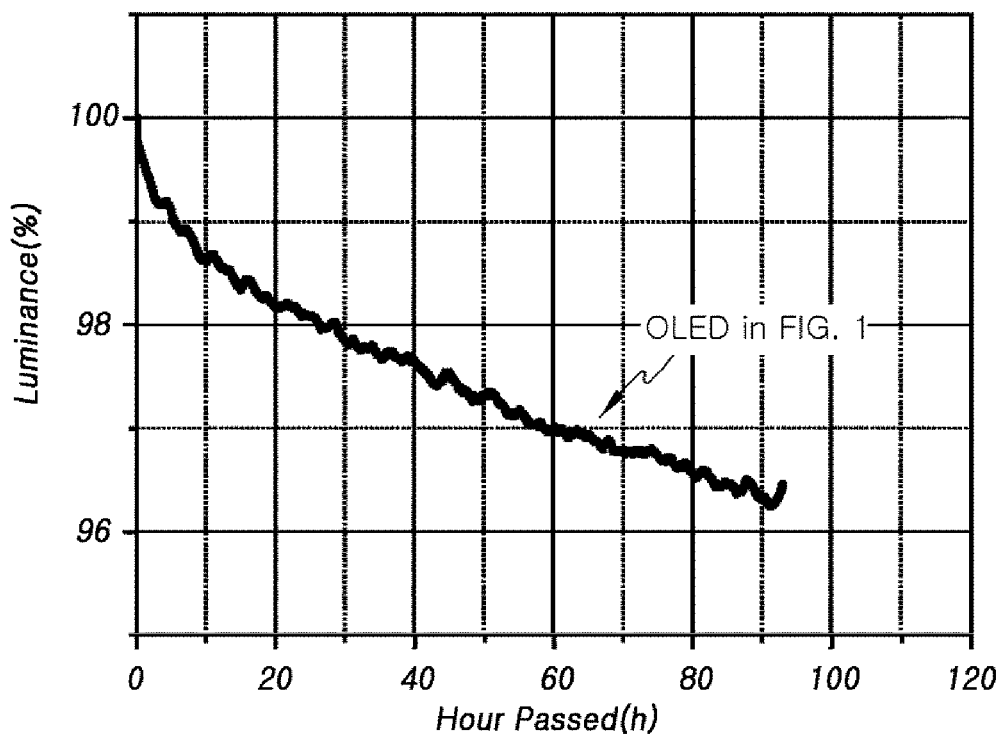

FIGS. 6*a* to 6*c* show voltage-current characteristics, luminance-current efficiency characteristics, and lifetime characteristics of a first sub-pixel in each of the organic light emitting element according to the embodiment in FIG. 1, the organic light emitting element according to Comparative Embodiment 1 in FIG. 2*c*, and the organic light emitting element according to Comparative Embodiment 2 in FIG. 5.

As shown in FIGS. 6*a* to 6*c*, the voltage-current characteristics, luminance-current efficiency characteristics, and lifetime characteristics of the first sub-pixel (for example, a blue sub-pixel) may be substantially the same among the organic light emitting element 100 according to the embodiment in FIG. 1, the organic light emitting element 200 according to Comparative Embodiment 1 in FIG. 2*c*, and the organic light emitting element 500 according to Comparative Embodiment 2 in FIG. 5. The reason is that, from an aspect of the first sub-pixel, the lamination structure of the first sub-pixel (for example, a blue sub-pixel) was the same among the organic light emitting element 100 according to the embodiment in FIG. 1, the organic light emitting element 200 according to Comparative Embodiment 1 in FIG. 2*c*, and the organic light emitting element 500 according to Comparative Embodiment 2 in FIG. 5.

Figure 7A:
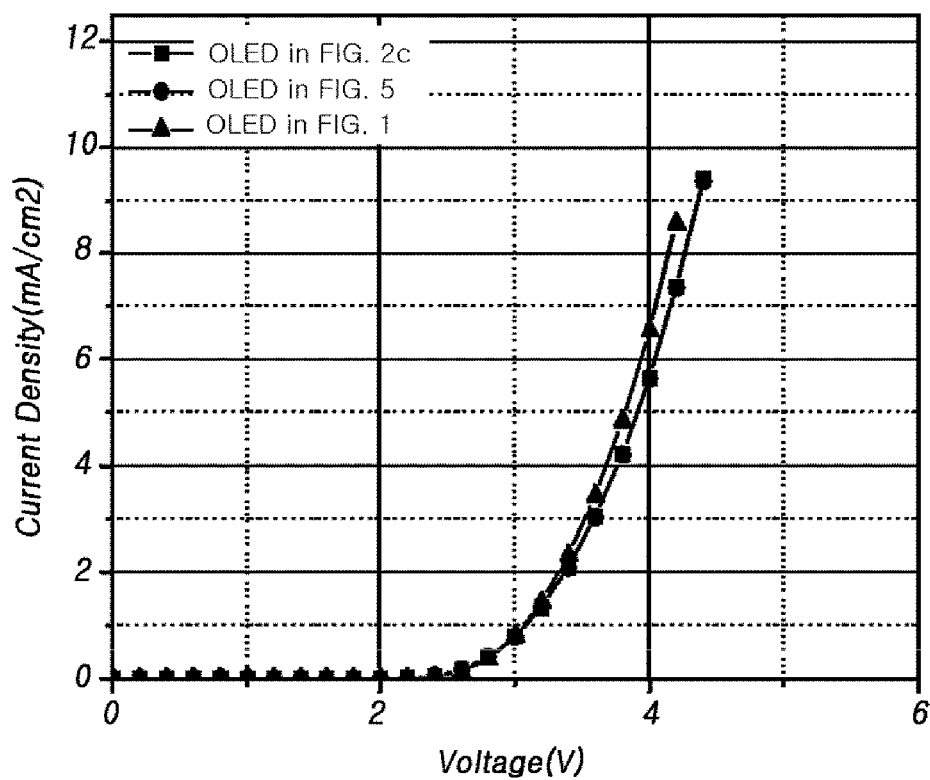
FIGS. 7a to 7c show voltage-current characteristics, luminance-current efficiency characteristics, and lifetime characteristics of a second sub-pixel in each of the organic light emitting element according to the embodiment in FIG. 1, the organic light emitting element according to Comparative Embodiment 1 in FIG. 2c, and the organic light emitting element according to Comparative Embodiment 2 in FIG. 5.
Figure 7B:
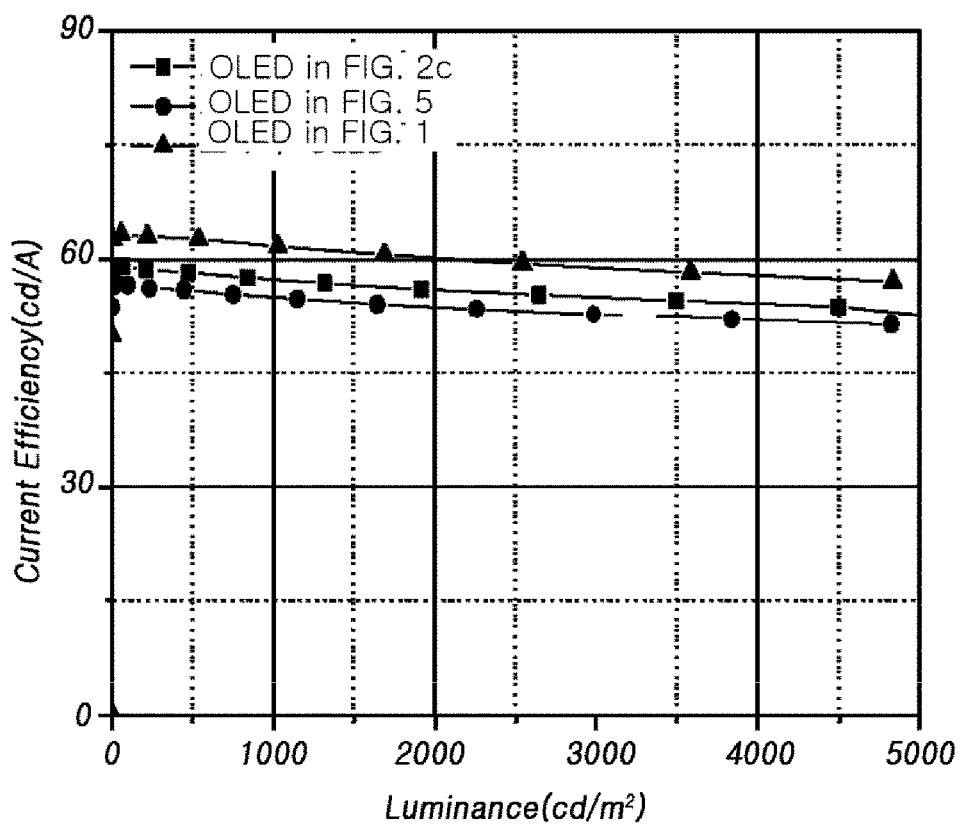
Figure 7C:
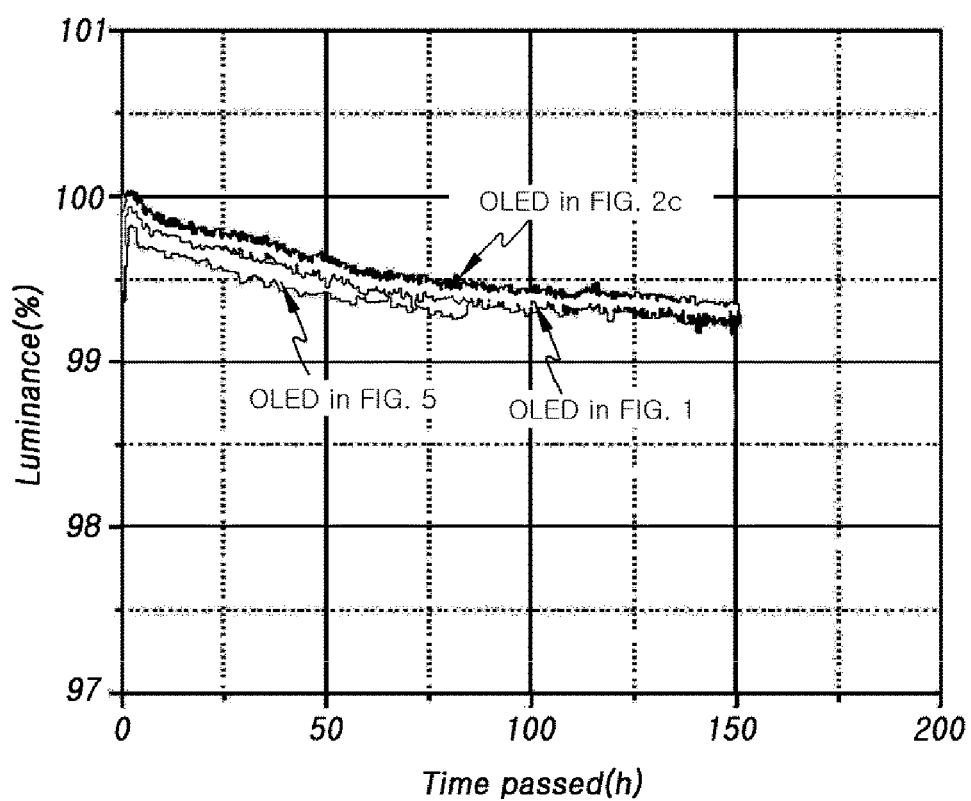

FIGS. 7*a* to 7*c* show voltage-current characteristics, luminance-current efficiency characteristics, and lifetime characteristics of a second sub-pixel in each of the organic light emitting element according to the embodiment of FIG. 1, the organic light emitting element according to Comparative Embodiment 1 of FIG. 2*c*, and the organic light emitting element according to Comparative Embodiment 2 of FIG. 5.

As shown in FIG. 7*a*, the voltage-current characteristics of the second sub-pixel (for example, a green sub-pixel) of the organic light emitting element 100 of the embodiment in FIG. 1 were relatively somewhat better than those of the second sub-pixel (for example, a green sub-pixel) of each of the organic light emitting element 200 according to Comparative Embodiment 1 in FIG. 2*c* and the organic light emitting element 500 according to Comparative Embodiment 2 in FIG. 5.

Meanwhile, as shown in FIG. 7*b*, the luminance-current efficiency characteristics of the second sub-pixel (for example, a green sub-pixel) of the organic light emitting element 100 of the embodiment in FIG. 1 was relatively excellent compared with those of the second sub-pixel (for example, a green sub-pixel) of each of the organic light emitting element 200 according to Comparative Embodiment 1 in FIG. 2c and the organic light emitting element 500 according to Comparative Embodiment 2 in FIG. 5. The reason is that, as described with respect to FIGS. 2a and 2b, the second sub-pixel (for example, a green sub-pixel) of the organic light emitting element 100 according to the embodiment in FIG. 1 satisfies a microcavity effect, and, from an aspect of the energy level, holes can be efficiently transported according to the HOMO level by stages from the first electrode 120 to the first auxiliary light emitting layer 150B' and to the second auxiliary light emitting layer 150G' via the hole transport layer 140.

As shown in FIG. 7c, the lifetime characteristics of the second sub-pixel (for example, a green sub-pixel) may be substantially the same among the organic light emitting element 100 according to the embodiment in FIG. 1, the organic light emitting element 200 according to Comparative Embodiment 1 in FIG. 2c, and the organic light emitting element 500 according to Comparative Embodiment 2 in FIG. 5.

Figure 8A:
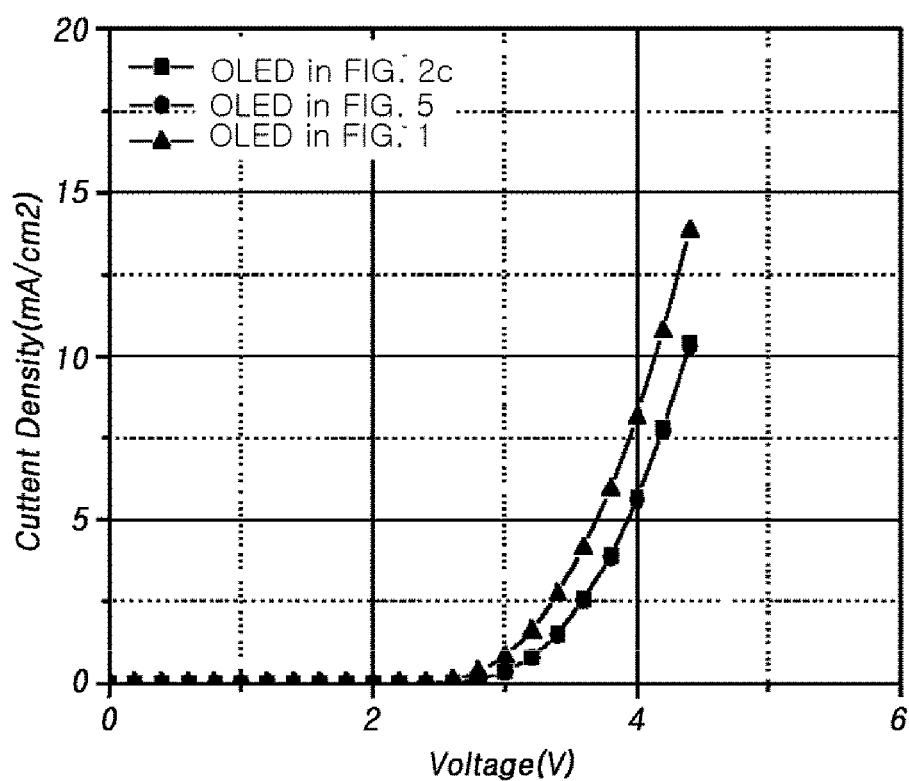
FIGS. 8a to 8c show voltage-current characteristics, luminance-current efficiency characteristics, and lifetime characteristics of a third sub-pixel in each of the organic light emitting element according to the embodiment in FIG. 3, the organic light emitting element according to Comparative Embodiment 1 in FIG. 2c, and the organic light emitting element according to Comparative Embodiment 2 in FIG. 5.
Figure 8B:
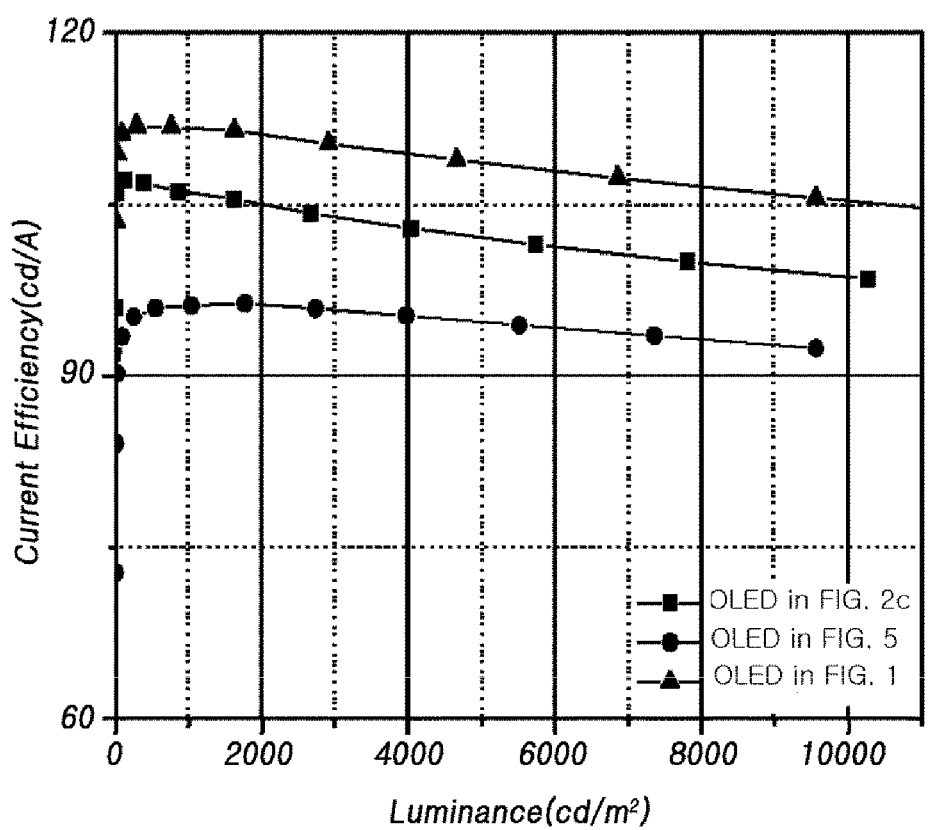
Figure 8C:
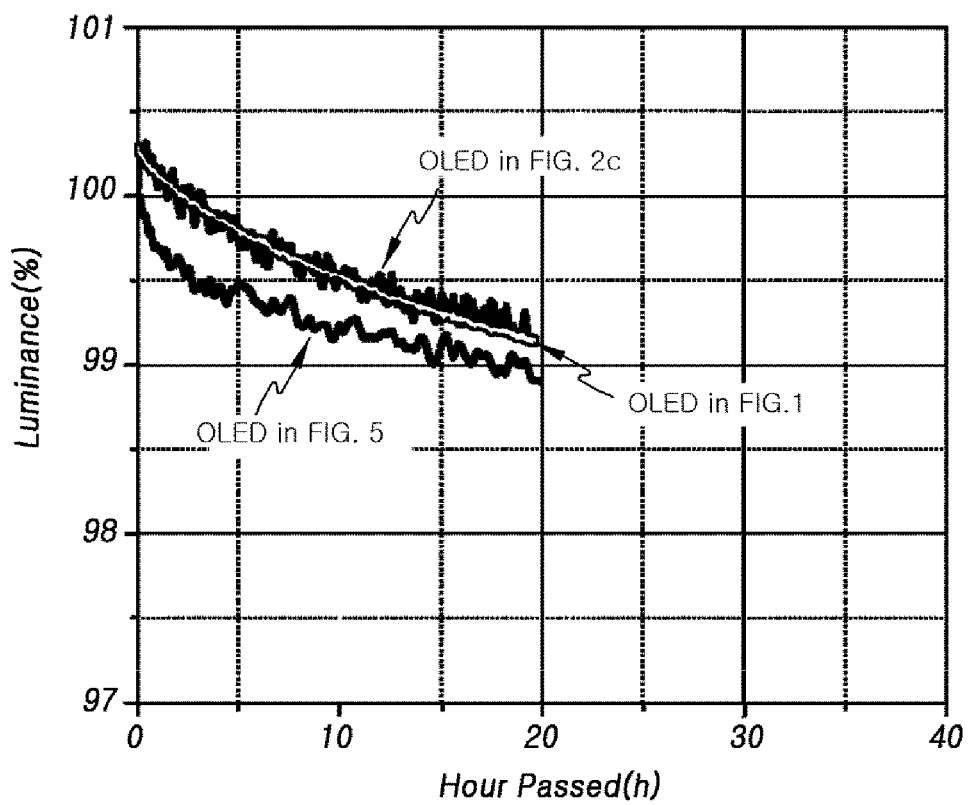

FIGS. 8a to 8c show voltage-current characteristics, luminance-current efficiency characteristics, and lifetime characteristics of a third sub-pixel in each of the organic light emitting element according to the embodiment of FIG. 1, the organic light emitting element according to Comparative Embodiment 1 of FIG. 2c, and the organic light emitting element according to Comparative Embodiment 2 of FIG. 5.

As shown in FIG. 8a, the voltage-current characteristics of the second sub-pixel (for example, a green sub-pixel) of the organic light emitting element 100 of the embodiment of FIG. 1 were relatively better than those of the third sub-pixel (for example, a red sub-pixel) in each of the organic light emitting element 200 according to Comparative Embodiment 1 in FIG. 2c and the organic light emitting element 500 according to Comparative Embodiment 2 in FIG. 5.

Meanwhile, as shown in FIG. 8b, the luminance-current efficiency characteristics of the third sub-pixel (for example, a red sub-pixel) of the organic light emitting element 100 in an embodiment of FIG. 1 were relatively excellent compared with those of the third sub-pixel (for example, a red sub-pixel) of each of the organic light emitting element 200 according to Comparative Embodiment 1 in FIG. 2c and the organic light emitting element 500 according to Comparative Embodiment 2 in FIG. 5. The reason is that, as described with respect to FIGS. 2a and 2b, the third sub-pixel (for example, a red sub-pixel) of the organic light emitting element 100 according to the embodiment in FIG. 1 satisfies a microcavity effect, and, from the aspect of the energy level, holes can be efficiently transported according to the HOMO level by stages from the first electrode 120, via the hole transport layer 140, to the first auxiliary light emitting layer 150B', the second auxiliary light emitting layer 150R'.

As shown in FIG. 8c, the lifetime characteristics of the third sub-pixels (for example, a red sub-pixel) were the same between the organic light emitting element 100 according to the embodiment in FIG. 1 and the organic light emitting element 200 according to Comparative Embodiment 1 in FIG. 2c, but said characteristics were excellent compared with the lifetime characteristics of the third sub-pixel (for example, a red sub-pixel) of the organic light emitting element 500 according to Comparative Embodiment 2 in FIG. 5.

Particularly, from the aspect of luminous efficiency and the lifetime of an organic light emitting element, the luminous efficiency was relatively higher and the lifetime was relatively longer in the second and third sub-pixels (for example, green and red sub-pixels) of the organic light emitting element 100 according to the embodiment in FIG. 1 rather than those of the organic light emitting element 500 according to Comparative Embodiment 2 in FIG. 5. In other words, the organic light emitting element 100 according to the embodiment in FIG. 1 can exhibit higher luminous efficiency and relatively longer lifetime due to the charge balance in the organic light emitting layers 160, as described with reference to FIGS. 2b and 5. In addition, the organic light emitting element 100 according to the embodiment in FIG. 1 can have increased lifetime since polarons, which cause dopant quenching in the organic light emitting layers 160 and device deterioration, was reduced, leading to reductions in dopant quenching and device deterioration that may be caused by extra polarons.

Figure 9:
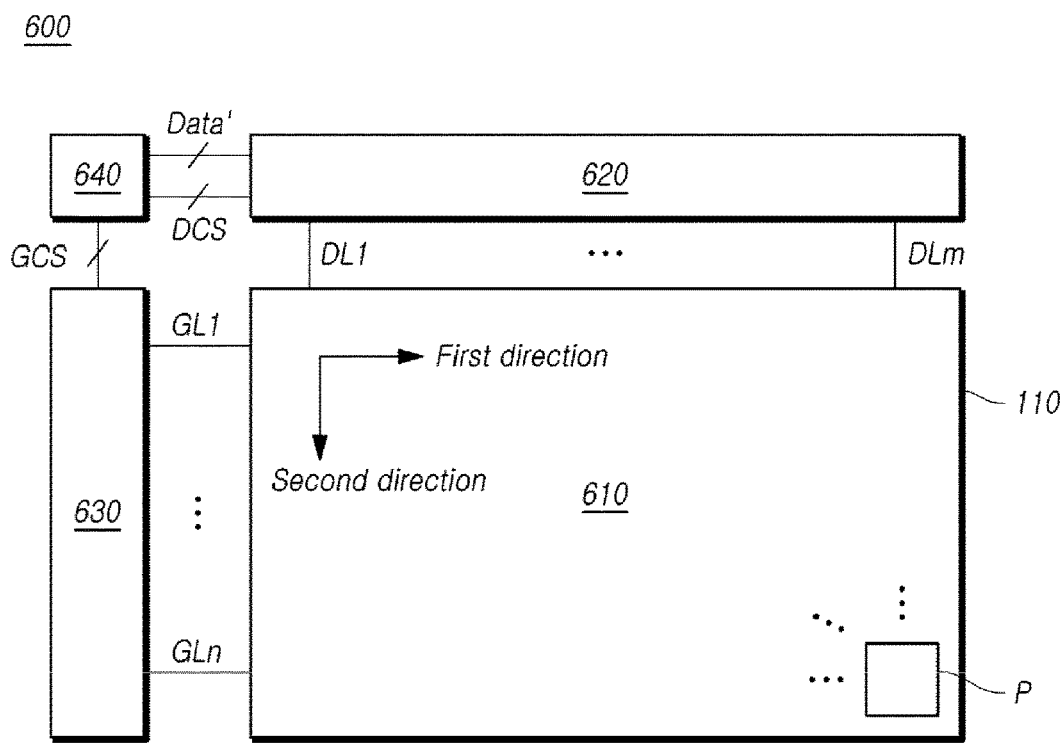
FIG. 9 is a conceptual diagram of an organic light emitting display device according to still another embodiment.

FIG. 9 is a conceptual diagram of an organic light emitting display according to still another embodiment.

Referring to FIG. 9, an organic light emitting display device 600 according to still another embodiment includes: a display panel 610 in which n gate lines GL1, . . . , GLn (n: natural number) are formed in a first direction (e.g., horizontal direction) and m data lines DL1, . . . , DLm (m: natural number) are formed in a second direction (e.g., longitudinal direction) crossing the first direction; a data driver 620 for driving the m data lines DL1, . . . , DLm; a gate driver 630 for sequentially driving the n gate lines GL1, . . . , and GLn; and a timing controller 640 for controlling the data driver 620 and the gate driver 630.

In the display panel 610, sub-pixels SP are formed in a matrix form at crossings of one or more data line and one or more gate lines.

Through the plurality of sub-pixels, a plurality of pixels P are arranged in a matrix form in a display panel 610.

The timing controller 640 initiates scanning in response to the timing implemented in each frame, converts image data, inputted from an interface, to be suitable for the data signal format used in the data driver 620, outputs the converted image data, and controls data driving at a suitable time according to the scan.

The timing controller 640 may output various control signals, such as a data control signal DSC and a gate control signal GSC in order to control the data driver 620 and the gate deriver 630.

The gate driver 630 sequentially drives n gate lines GL1, . . . , GLn by sequentially supplying a scan signal of On-voltage or Off-voltage to n gate lines GL1, . . . , GLn according to the control of the timing controller 640.

The data driver 620 drives m data lines DL1, . . . , DLm by storing the input image data Data in a memory (not shown), converting corresponding image data Data into an analog data voltage Vdata when a particular gate line is opened, and supplying the data voltage Vdata to m data lines DL1, . . . , DLm, according to the control of the timing controller 640.

Still another embodiment may include: an electronic apparatus including: an organic light emitting display device 600 including the foregoing organic light emitting element 100 of the present invention; and a controller for controlling the display device 600. Here, the electronic apparatus may be a current or future wired or wireless communication terminal, and encompasses all electronic apparatuses, such as a mobile communication terminal such as a mobile phone, a PDA, an electronic dictionary, a PMP, a remote controller, a navigation device, a game machine, various TVs, and various computers.

Figure 10:
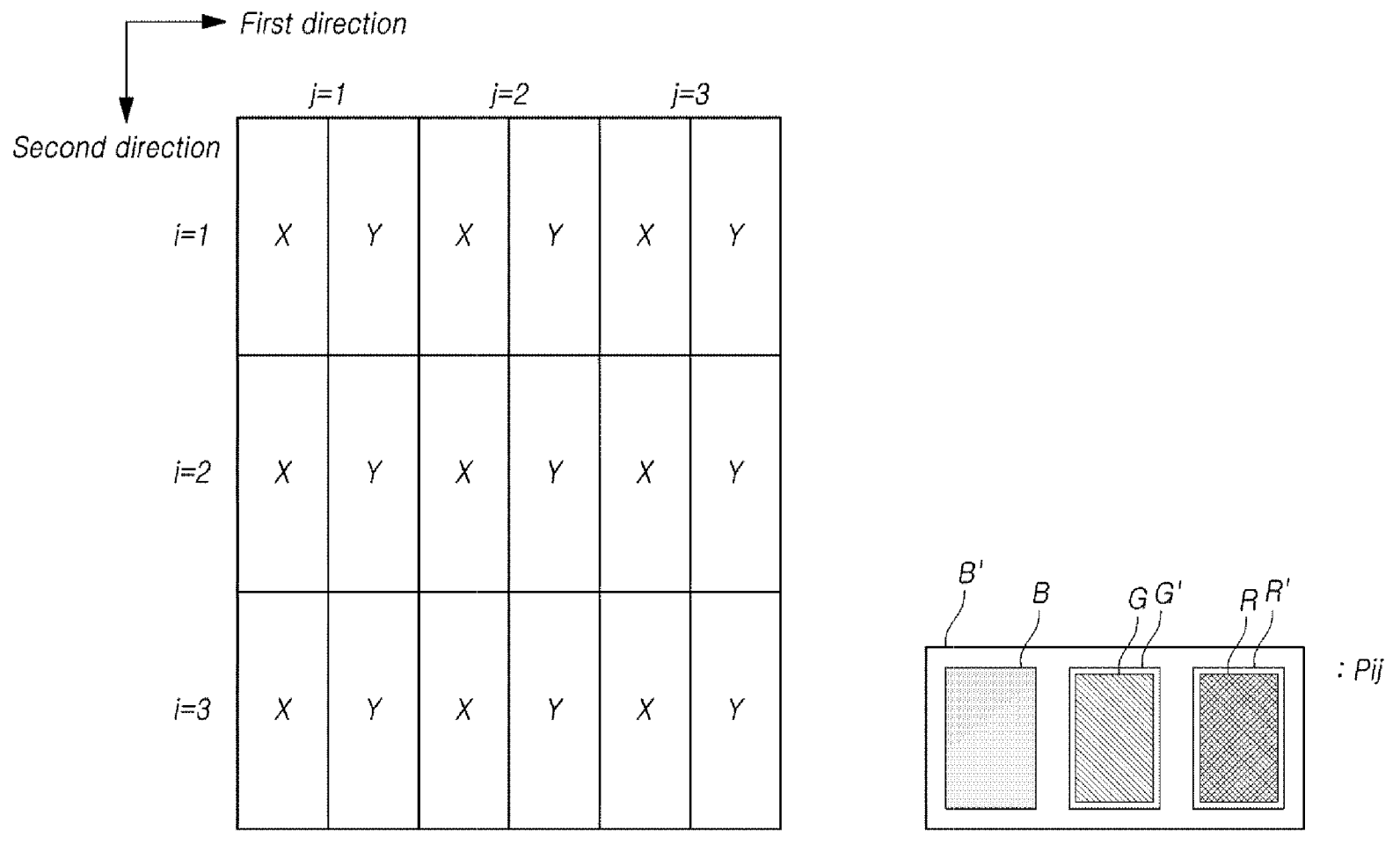

FIG. 10 shows a pixel structure of the organic light emitting display panel in FIG. 9.

Referring to FIGS. 9 and 10, pixels Pij at row i and column j (i=1, 2, . . . , j=1, 2, . . . ) are arranged in a matrix form in the display panel 610.

Each pixel Pij may include three sub-pixels. That is, each pixel Pij may include a red sub-pixel R, a green sub-pixel G, and a blue sub-pixel B.

The shape, placement, and number of sub-pixels of each pixel Pij may be variously changed, and another pixel, such as a white pixel for displaying white, may be further included.

Hereafter, one pixel included in the organic light emitting display device will be described in detail with reference to FIGS. 9 and 10 together with FIG. 1 shown above.

Figure 11:
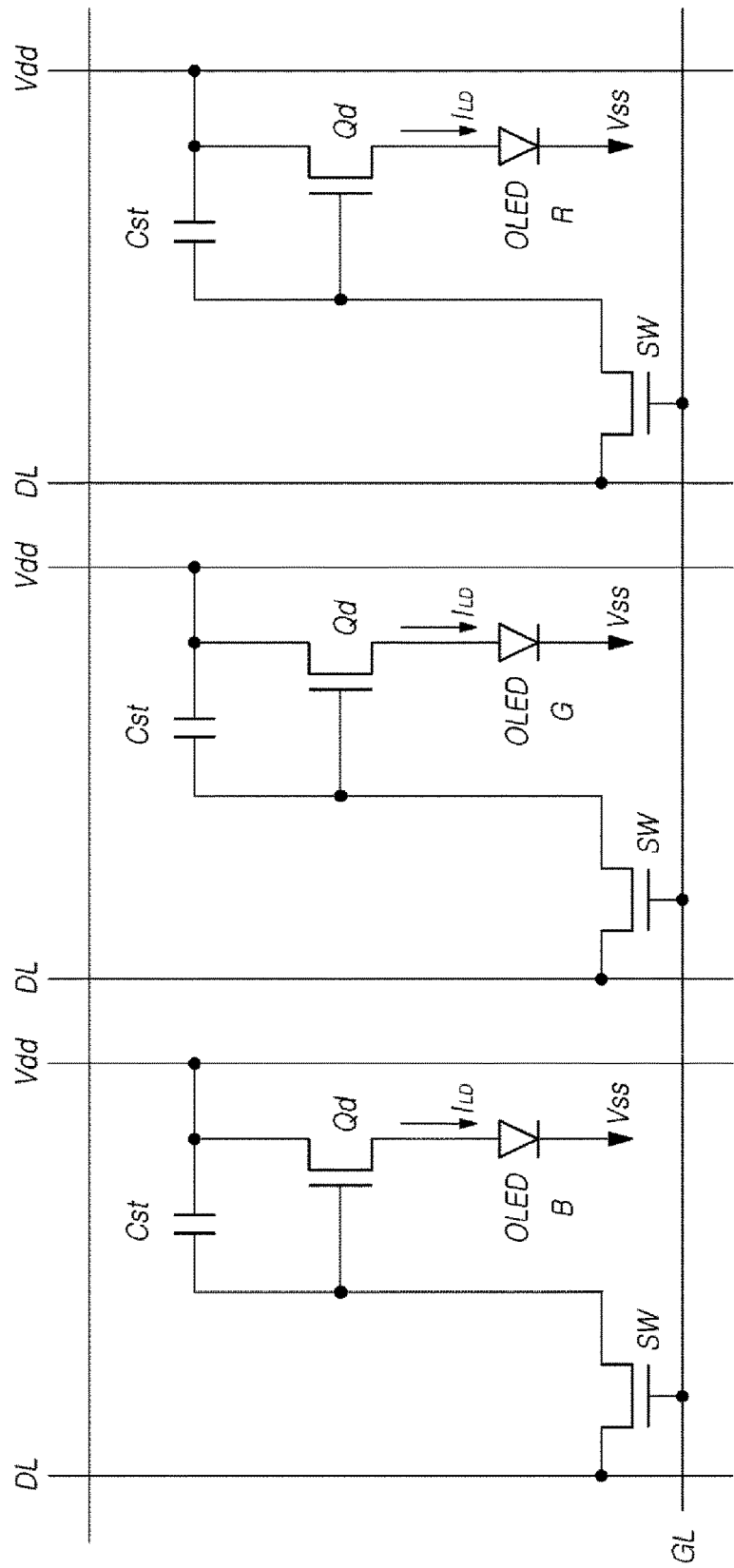
FIG. 11 is a circuit diagram of each pixel of the organic light emitting display panel in FIG. 9.

FIG. 11 is a circuit diagram of each pixel of the organic light emitting display panel in FIG. 9.

Referring to FIGS. 1 and 8, the organic light emitting display panel 610 in FIG. 9 includes pixels of i rows and j columns, Pij (i=1, 2, . . . , j=1, 2, . . . ) arranged in a matrix form in the display panel 610. In each pixel (Pij) of the organic light emitting display panel 610, the first sub-pixel B, the second sub-pixel G, and the third sub-pixel R each have a driving transistor Qd including a source, a drain, a gate, and an active layer.

In addition, each pixel Pij includes the organic light emitting element 100 shown in FIG. 1, which includes the first sub-pixel B, the second sub-pixel G, and the third sub-pixel R with different colors on the substrate. Each of the first electrodes 120 of the organic light emitting element, which are respectively disposed in the first sub-pixel B, the second sub-pixel G, and the third sub-pixel R, is electrically connected to any one of the source and the drain of the driving transistor Qd. The one of the source and drain of the transistor in FIG. 1 is one of the source and the drain of the driving transistor Qd in FIG. 8.

Each pixel Pij may include: a switching transistor SW, for switching the data voltage with respect to the driving transistor Qd; and a storage capacitor Cst for maintaining the data voltage for a predetermined period, for example, one frame.

The switching transistor SW and the driving transistor Qd are n-channel field effect transistors (FETs), but at least one of these may be a p-channel field effect transistor. In addition, the connection relationships among the two transistors SW and Qd, the storage capacitor Cst, and the organic light emitting element may be changed.

The foregoing organic light emitting element and the organic light emitting display device according to the embodiments can minimize the patterning of light emitting regions at the time of manufacture.

Furthermore, the foregoing organic light emitting display device and the organic light emitting element according to the embodiments can attain improved luminous performance.

In the description above, although all of the components of the embodiments of the present disclosure may have been explained as assembled or operatively connected as a unit, the present disclosure is not intended to limit itself to such embodiments. Rather, within the objective scope of the present disclosure, the respective components may be selectively and operatively combined in any numbers. Although exemplary embodiments of the present disclosure have been described for illustrative purposes, those skilled in the art will appreciate that various modifications, additions and substitutions are possible, without departing from the scope and spirit of the disclosure. Therefore, exemplary embodiments of the present disclosure have not been described for limiting purposes. Accordingly, the scope of the disclosure is not to be limited by the above embodiments but by the claims and the equivalents thereof.

The invention claimed is:

1. An organic light emitting element having first, second, and third sub-pixels with different colors on a substrate, the organic light emitting element comprising:
   first electrodes disposed on the substrate;
   a second electrode disposed on the substrate to face the first electrodes;
   organic light emitting layers disposed between the first electrodes and the second electrode, the organic light emitting layers comprising a first organic light emitting layer disposed in the first sub-pixel, a second organic light emitting layer disposed in the second sub-pixel, and a third organic light emitting layer disposed in the third sub-pixel;
   a hole transport layer disposed between the first electrodes and the organic light emitting layers; and
   auxiliary light emitting layers disposed between the hole transport layer and the organic light emitting layers, the auxiliary light emitting layers comprising: a first auxiliary light emitting layer commonly disposed in the first sub-pixel, the second sub-pixel, and the third sub-pixel; a second auxiliary light emitting layer disposed in the second sub-pixel between the first auxiliary light emitting layer and the second organic light emitting layer, and a third auxiliary light emitting layer disposed in the third sub-pixel between the first auxiliary light emitting layer and the third light emitting layer,
   wherein the first sub-pixel comprises the first auxiliary light emitting layer disposed between the hole transport layer and the first organic light emitting layer,
   wherein the second sub-pixel comprises the first auxiliary light emitting layer and the second auxiliary light emitting layer between the hole transport layer and the second organic light emitting layer,
   wherein the third sub-pixel comprises the first auxiliary light emitting layer and the third auxiliary light emitting layer between the hole transport layer and the third organic light emitting layer, and
   wherein the highest occupied molecular orbital (HOMO) level of the first auxiliary light emitting layer is larger than the HOMO level of the hole transport layer, and smaller than the HOMO level of the second auxiliary light emitting layer and the third auxiliary light emitting layer,
   wherein the first auxiliary light emitting layer, the second auxiliary light emitting layer, and the third auxiliary light emitting layer are formed of a hole transporting material.

2. The organic light emitting element of claim 1, wherein the third auxiliary light emitting layer is thicker than the second auxiliary light emitting layer.

3. The organic light emitting element of claim 2, wherein the second auxiliary light emitting layer is thicker than the first auxiliary light emitting layer.

* * * * *